(12) United States Patent
Yu et al.

(10) Patent No.: US 9,029,499 B2
(45) Date of Patent: May 12, 2015

(54) SEMICONDUCTING POLYMERS

(71) Applicant: University of Chicago, Chicago, IL (US)

(72) Inventors: Luping Yu, Chicago, IL (US); Yongye Liang, Stanford, CA (US)

(73) Assignee: University of Chicago, Chicago, IL (US)

( * ) Notice: Subject to any disclaimer, the term of this patent is extended or adjusted under 35 U.S.C. 154(b) by 0 days.

(21) Appl. No.: 14/183,151

(22) Filed: Feb. 18, 2014

(65) Prior Publication Data

US 2014/0235817 A1    Aug. 21, 2014

Related U.S. Application Data

(63) Continuation of application No. 13/888,738, filed on May 7, 2013, now Pat. No. 8,653,228, which is a continuation of application No. 13/054,719, filed as application No. PCT/US2009/044364 on May 18, 2009, now Pat. No. 8,436,134.

(60) Provisional application No. 61/082,071, filed on Jul. 18, 2008, provisional application No. 61/082,418, filed on Jul. 21, 2008.

(51) Int. Cl.
*C08G 75/00* (2006.01)
*C08G 75/06* (2006.01)
*C08G 73/18* (2006.01)
*C08G 73/22* (2006.01)
*H01L 51/00* (2006.01)
*H01L 51/42* (2006.01)
*C09B 69/10* (2006.01)

(52) U.S. Cl.
CPC ............... *C08G 75/06* (2013.01); *C08G 73/18* (2013.01); *C08G 73/22* (2013.01); *H01L 51/0036* (2013.01); *H01L 51/4253* (2013.01); *Y02E 10/549* (2013.01); *C09B 69/109* (2013.01)

(58) Field of Classification Search
USPC ......................................... 528/377, 380, 378
See application file for complete search history.

(56) References Cited

U.S. PATENT DOCUMENTS

| 7,183,418 B2 | 2/2007 | Heeney et al. |
| 7,332,223 B2 | 2/2008 | Sotzing et al. |
| 8,436,134 B2 * | 5/2013 | Yu et al. ......................... 528/377 |

(Continued)

FOREIGN PATENT DOCUMENTS

| WO | WO 2008/011957 A1 | 1/2008 |
| WO | WO 2010/008672 A1 | 1/2010 |

(Continued)

OTHER PUBLICATIONS

Chen, et al., "Hierarchical Nanomorphologies Promote Exciton Dissociation in Polymer/Fullerene Bulk Heterojunction Solar Cells," *Nano Letters*, vol. 11, pp. 3707-3713 (2011).
Facchetti, "PI-Conjugated Polymers for Organic Electronics and Photovoltaic Cell Application," *Chemistry of Materials*, vol. 23, pp. 733-758 (2011).

(Continued)

*Primary Examiner* — Shane Fang
(74) *Attorney, Agent, or Firm* — Brinks Gilson & Lione; Ryan L. Marshall

(57) ABSTRACT

Novel semiconducting photovoltaic polymers with conjugated units that provide improved solar conversion efficiency that can be used in electro-optical and electric devices. The polymers exhibit increased solar conversion efficiency in solar devices.

19 Claims, 8 Drawing Sheets

(56) References Cited

U.S. PATENT DOCUMENTS

2005/0082525 A1    4/2005   Heeney et al.
2005/0209419 A1    9/2005   Zahn et al.
2008/0102559 A1    5/2008   Ong et al.
2008/0103286 A1    5/2008   Ong et al.
2011/0124822 A1    5/2011   Yu et al.

FOREIGN PATENT DOCUMENTS

WO    WO 2010/020329 A1    2/2010
WO    WO 2011/067192 A2    6/2011
WO    WO 2011/156478 A2    12/2011

OTHER PUBLICATIONS

International Search Report for PCT/US2009/044364, dated Aug. 27, 2009, 3 pages.

International Search Report for PCT/US2012/033601, dated Sep. 6, 2012, 3 pages.

International Search Report for PCT/US2013/024337, dated Apr. 16, 2013, 3 pages.

Liang, Y., et al., "Control in Energy Levels of Conjugated Polymers for Photovoltaic Application," *J.Phys. Chem. C*, vol. 112, pp. 7866-7871 (2008).

\* cited by examiner

SEMICONDUCTING POLYMERS

REFERENCE TO RELATED APPLICATIONS

This application continuation of U.S. patent application Ser. No. 13/888,738, filed May 7, 2013, now U.S. Pat. No. 8,653,228 issued Feb. 18, 2014, which is a continuation of U.S. patent application Ser. No. 13/054,719, filed Jan. 18, 2011, now U.S. Pat. No. 8,436,134, issued May 7, 2013, which is a 371 national phase of International Application No. PCT/US2009/044364, filed May 18, 2009, which claims the benefit of U.S. Provisional Application Nos. 61/082,071 and 61/082,418, filed Jul. 18, 2008, and Jul. 21, 2008, respectively, both entitled "Semiconducting Polymers," the contents of which are incorporated herein by reference in their entirety.

GOVERNMENT INTERESTS

This invention was made with Government support under Grant No. DMR-0703274, awarded by the National Science Foundation. The Government may have certain rights to this invention.

TECHNICAL FIELD

This invention relates to semiconducting polymers based on semiconducting conjugated polymers. This invention also relates to their use in electro-optical and electronic devices.

BACKGROUND

Solar energy harvest using photovoltaic effect requires active semiconducting materials to convert light into electricity. Currently, solar cells based on silicon are the dominating technology due to their high conversion efficiency. Recently, solar cells based on organic materials showed interesting features, especially on the potential of low cost in materials and processing. Judging from the recent success in organic light emitting diodes based on a reverse effect of photovoltaic effect, organic solar cells are very promising. Bulk hetero junction (BHJ) made from phase separated blends of semiconducting polymers and fullerides is a popular structure that has been adopted for polymer solar cells. Current solar cells exhibit low power conversion efficiency, about 4%-5%, compared to silicon based solar cells, even after sophisticated device optimizations.

Conjugated polymers have shown some promise in providing a photovoltaic effect. Conjugated polymers are made of alternating single and double carbon-carbon (C—C) or carbon-nitrogen (C—N) bonds. The conjugated polymers have a δ-bond backbone of intersecting $sp^2$ hybrid orbitals. The $p_z$ orbitals on the carbon atoms overlap with neighboring $p_z$ orbitals to provide π-bonds. The electrons that comprise the π-bonds are delocalized over the whole molecule. These polymers exhibit electronic properties similar to those seen in inorganic semiconductors. The semiconducting properties of the photovoltaic polymers are derived from their delocalized π bonds.

There is a need in the art for polymer solar cells that exhibit increased solar conversion efficiency.

BRIEF SUMMARY

Described herein are semiconducting photovoltaic polymers that exhibit high solar conversion efficiencies when used in electro-optical and electronic devices. There are also semiconducting polymers that are used as hole transporting material with fullerene derivatives as acceptors in electro-optical and electronic devices. The polymers are designed to achieve a low bandgap for broad absorption in the solar spectrum.

The present disclosure describes a semiconducting polymer of the formula (I):

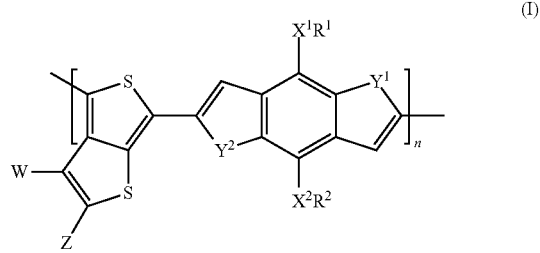

where $X^1$ and $X^2$ are independently O, S, N, NH, a cross-linkable group such as an acrylate group, or $CR^1$ or $CR^2$, where $R^1$ and $R^2$ are independently H, alkyl, alkoxy, aryl, aryloxy, heteroaryl, heteroaryloxy, cross-linkable moiety, oligo (ethylene glycol); $Y^1$ and $Y^2$ are independently O, S, Se, amino; Z is an ester, amide, cyano, alkyl, or polyfluoroalkyl, polychloroalkyl, aryl, heteroaryl; W is H, halogen, cyano, dicyanovinyl, or tricyanovinyl; and n is an integer.

The semiconducting polymer can also be formula (I) where $X^1$ and $X^2$ are $CH_2$, $Y^1$ and $Y^2$ are S, Z is COOR", W is H, $R^1$ and $R^2$ are $C_7H_{15}$, and R" has the formula

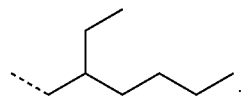

The semiconducting polymer can also be formula (I) where $X^1$ and $X^2$ are O, $Y^1$ and $Y^2$ S, Z is COOR", W is F or H, $R^1$ and $R^2$ have the following formula:

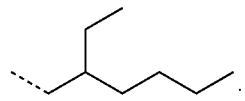

Also provided herein is a photovoltaic film comprising a fullerene derivative and a semiconducting polymer of the formula (I):

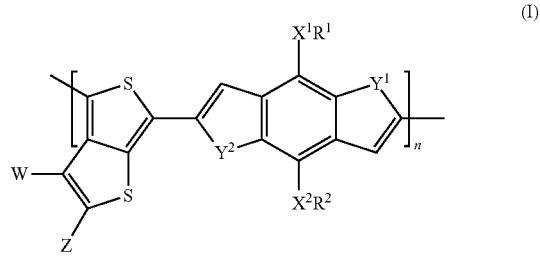

where $X^1$ and $X^2$ are independently O, S, N, NH, a cross-linkable group such as an acrylate group, or $CR^1$ or $CR^2$, where $R^1$ and $R^2$ are independently H, alkyl, alkoxy, aryl, aryloxy, heteroaryl, heteroaryloxy, cross-linkable moiety, oligo(ethylene glycol); $Y^1$ and $Y^2$ are independently O, S, Se, amino; Z is an ester, amide, cyano, alkyl, or polyfluoroalkyl, polychloroalkyl, aryl, heteroaryl; W is H, halogen, cyano, dicyanovinyl, or tricyanovinyl; and n is an integer.

DETAILED DESCRIPTION OF THE DRAWINGS AND THE PREFERRED EMBODIMENTS

Figure 1:
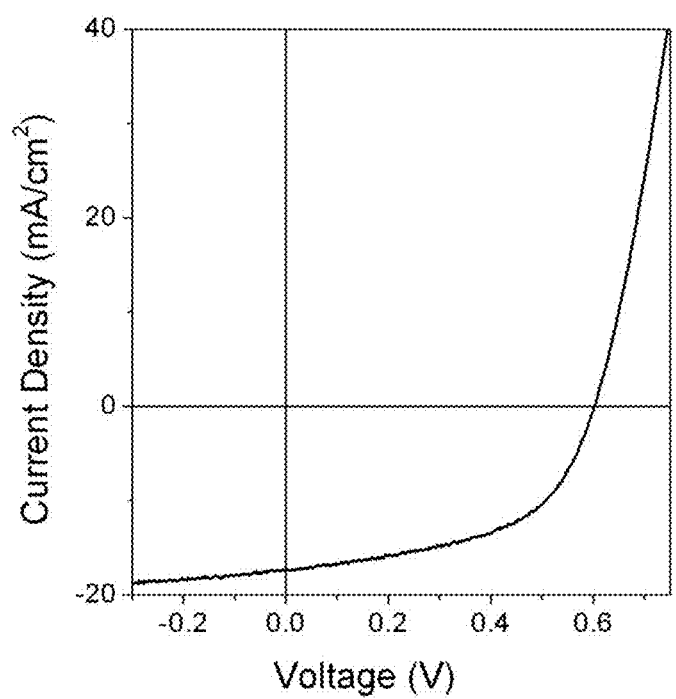
FIG. 1 is a graph of the current-voltage characteristics of a device made with a semiconducting photovoltaic polymer prepared as described herein.

Unless defined otherwise, all technical and scientific terms used herein have the same meaning as commonly understood to one of ordinary skill in the art to which this invention belongs. When describing the compounds, compositions, methods and processes of this invention, the following terms have the following meanings, unless otherwise indicated.

"Alkyl" by itself or as part of another substituent refers to a hydrocarbon group which may be linear, cyclic, or branched or a combination thereof having the number of carbon atoms designated (i.e., $C_{1-8}$ means one to eight carbon atoms). Examples of alkyl groups include methyl, ethyl, n propyl, isopropyl, n butyl, t butyl, isobutyl, sec butyl, cyclohexyl, cyclopentyl, (cyclohexyl)methyl, cyclopropylmethyl, bicyclo[2.2.1]heptane, bicyclo[2.2.2]octane, etc. Alkyl groups can be substituted or unsubstituted, unless otherwise indicated. Examples of substituted alkyl include haloalkyl, polyhaloalkly, such as polyfluoroalkyl and polychloroalkyl, aminoalkyl, and the like.

"Alkoxy" refers to —O-alkyl. Examples of an alkoxy group include methoxy, ethoxy, n-propoxy etc.

"Aryl" refers to a polyunsaturated, aromatic hydrocarbon group having a single ring (monocyclic) or multiple rings (bicyclic), which can be fused together or linked covalently. Aryl groups with 6-10 carbon atoms are preferred, where this number of carbon atoms can be designated by $C_{6-10}$, for example. Examples of aryl groups include phenyl and naphthalene-1-yl, naphthalene-2-yl, biphenyl and the like. Aryl groups can be substituted or unsubstituted, unless otherwise indicated. "Aryloxy" refers to —O-aryl; and "heteroaryloxy" refers to the group —O-heteroaryl.

The term "amino" refers to —NRR' where R and R' are independently selected from hydrogen, alkyl, aryl, aralkyl and alicyclic, all except H are optionally substituted; and R and R' can form a cyclic ring system.

"Cyano" refers to —CN.

"Ester" refers to R' C(O))— where R' is a hydrogen atom, an alkyl group, an aryl group or an arylheterocyclic ring, as defined herein. "Arylheterocyclic ring" refers to a bi- or tricyclic ring comprised of an aryl ring, as defined herein, appended via two adjacent carbon atoms of the aryl ring to a heterocyclic ring, as defined herein. Exemplary arylheterocyclic rings include dihydroindole, 1,2,3,4-tetra-hydroquinoline, and the like.

"Halo" or "halogen," by itself or as part of a substituent refers to a chlorine, bromine, iodine, or fluorine atom.

"Haloalkyl," as a substituted alkyl group, refers to a monohaloalkyl or polyhaloalkyl group, most typically substituted with from 1-3 halogen atoms. Examples include 1-chloroethyl, 3-bromopropyl, trifluoromethyl and the like.

The term "heteroaryl," as used herein, refers to a mono-, bi-, or tri-cyclic aromatic radical or ring having from five to ten ring atoms of which at least one ring atom is selected from S, O, and N; zero, one or two ring atoms are additional heteroatoms independently selected from S, O, and N; and the remaining ring atoms are carbon, wherein any N or S contained within the ring may be optionally oxidized. Heteroaryl includes, but is not limited to, pyridinyl, pyrazinyl, pyrimidinyl, pyrrolyl, pyrazolyl, imidazolyl, thiazolyl, oxazolyl, isooxazolyl, thiadiazolyl, oxadiazolyl, thiophenyl, furanyl, quinolinyl, isoquinolinyl, benzimidazolyl, benzooxazolyl, quinoxalinyl, and the like. The heteroaromatic ring may be bonded to the chemical structure through a carbon or heteroatom.

"Heteroatom" is meant to include oxygen (O), nitrogen (N), sulfur (S) and silicon (Si).

The photovoltaic property of the polymers described herein was studied in polymer solar cells. Simple solar cells were used with semiconducting polymers of the formulas described herein. The power conversion efficiency (PCE) was greater than 3% in some embodiments. In embodiments that may be preferred, the semiconducting polymers yielded a PCE greater than 5%. The PCE reached 5.6% to 6.1% in some preferred embodiments.

The high conversion efficiency exhibit by the polymers described herein may be the result of an effective light harvest. The cells using the polymers absorb light in almost the entire visible spectrum. The polymer morphology also favors charge separation and charge transport. This can lead to high fill factors.

The polymers described herein are based on the concept that a thienothiophene moiety can support a quinoidal structure and lead to a narrow polymer bandgap that may have an effect on harvesting solar energy. Because the thienothiophene moiety is electron-rich, an electron-withdrawing ester group can be introduced to stabilize the resulting polymers.

The semiconducting polymers described herein may be represented by formula (I):

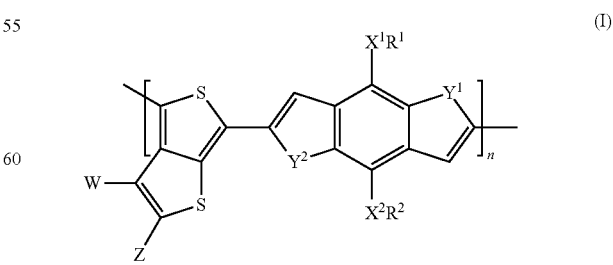

where $X_1$ and $X_2$ are independently O, S, N, NH, a cross-linkable group, or $CR^1$ or $CR^2$, where $R^1$ and $R^2$ are independently H, alkyl, alkoxy, aryl, aryloxy, heteroaryl, heteroaryloxy, a cross-linkable moiety, or oligo (ethylene glycol); $Y^1$ and $Y^2$ are independently O, S, Se, amino; Z is an ester, amide, cyano, alkyl, or polyfluoroalkyl, polychloroalkyl, aryl, heteroaryl; and W is H, halogen, cyano, dicyanovinyl, or tricyanovinyl. "n" is an integer or can be an integer from 1 to 200. $X^1$ and $X^2$ may be the same or different. $Y^1$ and $Y^2$ may be the same or different. $R^1$ and $R^2$ maybe the same or different.

Another embodiment may also comprise semiconducting polymers having the formula (I) where W represents F or H. $X^1$ and $X^2$ may independently represent $CH_2$ or O and $Y^1$ and $Y^2$ may independently represent S in some embodiments that may be preferred.

In some embodiments, Z may represent an ester or polyfluoroalkyl. Preferably, Z may represent COOR" where R" is alkyl, alkoxy, aryl, aryloxy, heteroaryl, heteroaryloxy. More preferably, R" may represent $C_mH_{2m+1}$ where m is an integer from 1 to 30. R" may be branched or, preferably, have the following formulae (II) and (III):

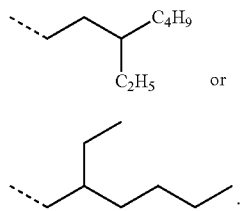

(II)

(III)

Z may also represent $C_nF_{2n+1}$ where n is an integer from 1 to 12 in some embodiments or $C_nH_{2n+1}$ where n is an integer from 1 to 12 in other embodiments. There are also embodiments where $R^1$, $R^2$, and R" are different.

In embodiments that may be preferred, the semiconducting polymers have the formula (I) where $X^1$ and $X^2$ can independently represent O, $Y^1$ and $Y^2$ can independently represents S, Z is COOR", W represents H, $R^1$ and $R^2$ independently represent $C_{12}H_{25}$, and R" is the formula (III):

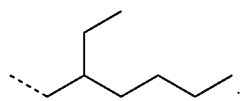

The semiconducting polymers may preferably have the formula (I) where $X^1$ and $X^2$ independently represent $CH_2$, $Y^1$ and $Y^2$ independently represent S, Z represents COOR", W represents H, $R^1$ and $R^2$ independently represent $C_{12}H_{25}$, and R" represents $C_8H^{17}$. The semiconducting polymers may have the formula (I) where $X^1$ and $X^2$ independently represent $CH_2$, $Y^1$ and $Y^2$ independently represent S, Z represents COOR", W represents H, $R^1$ and $R^2$ independently represent $C_7H_{15}$, and R" has the formula (III):

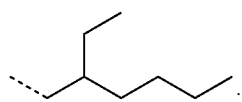

Also, preferably, the semiconducting polymers may have the formula (I) where $X^1$ and $X^2$ independently represent O, $Y^1$ and $Y^2$ independently represent S, Z represents COOR", W represents F. R", $R^1$ and $R^2$ can independently represent the same formula (III):

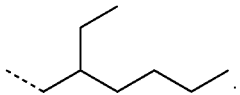

The semiconducting polymers may have the formula (I) where $X^1$ and $X^2$ independently represent O, $Y^1$ and $Y^2$ independently represent S, Z represents COOR", W represents F or H, R", $R^1$ and $R^2$ can independently represent the formula (III):

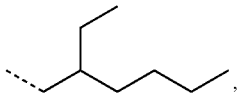

and R" is $C_8H_{17}$. In some preferred embodiments, $X^1$ and $X^2$ independently represent O, $Y^1$ and $Y^2$ independently represent S, Z represents $C_8F_{17}$, W represents H, $R^1$ and $R^2$ can independently represent $C_{12}H_{25}$, and R" represents $C_8H_{17}$.

The semiconducting polymers of the present invention also can have the formula (I) where $X^1$ and $X^2$ independently represent O, $Y^1$ and $Y^2$ independently represent S, Z represents COOR", W represents H, $R^1$ and $R^2$ can independently represent $C_8H_{17}$, and R" represents $C_{12}H_{25}$. Also, there are embodiments where $X^1$ and $X^2$ independently represent O, $Y^1$ and $Y^2$ independently represent S, Z represents COOR", W represents H, $R^1$ and $R^2$ can independently represent $C_8H_{17}$, and R" is the formula (II):

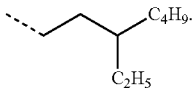

In some embodiments that may be preferred, $X^1$ and $X^2$ independently represent O, $Y^1$ and $Y^2$ independently represent S, Z represents COOR", W represents H, $R^1$ and $R^2$ can independently represent $C_8H_{17}$, and R" has the following formula

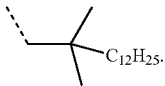

The semiconducting polymers of the present invention can also be of the formula (IV):

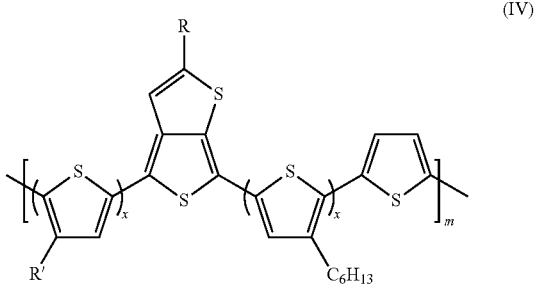

(IV)

where R represents polyfluoralkyl, polychloroalkyl, or an ester; R' represents alkyl, alkoxy, aryl, aryloxy, heteroaryl, or heteroaryloxy; X represents an integer from 1 to 12; and m is an integer from 1 to 200.

In some embodiments that may be preferred R represents $C_nF_{2n+1}$ where n is an integer from 1 to 12 or $-COOC_nH_{2n+1}$ where n is an integer from 1 to 30. R can represent $C_6F_{13}$, $R^1$ can represent $C_nH_{2n+1}$ where n is an integer from 1 to 12. In a preferred embodiment, $R^1$ represents $C_6H_{13}$, R represent $C_6F_{13}$, and X is 8.

Gel permeation chromatography studies showed a number averaged molecular weight of 18.3 k and weight averaged molecular weight of 22.9 k with a polydispersity of 1.25.

The present invention also comprises the conjugates of the semiconducting polymers (I) and (IV) described herein. The conjugates can be joined with electron accepting materials including, but not limited to, Buckminsterfullerene ("fullerene") derivatives. Any electron accepting fullerene can be used with the semiconducting polymers described herein. Such fullerenes can be from $C_{60}$ to $C_{90}$. In preferred embodiments the fullerene can be $C_{61}$, $C_{71}$, $C_{81}$, or $C_{91}$. The fullerene can be [6,6]-phenyl-C61-butyric acid methyl ester (PC61BM), having the following formula:

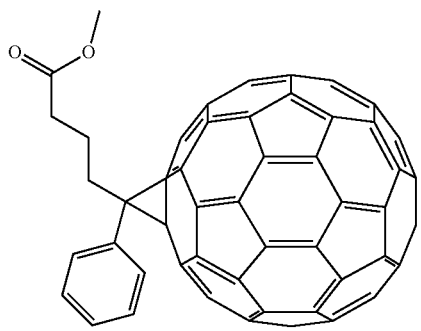

The polymer and fullerene can blend as a mixture. In another aspect of the invention, the conjugates can be joined with the fullerenes as shown below.

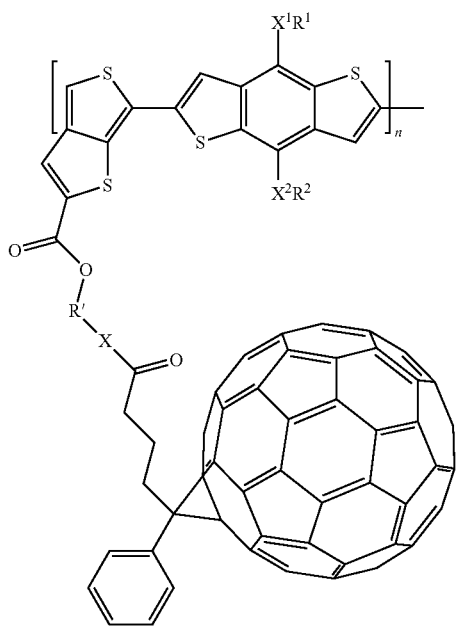

where
R'=—(CH2)m-, m=2-16
X=O, S, NH, —ONH—
$X^1$ and $X^2$ can be independently O, S, N, NH, a cross-linkable group, or $CR^1$ or $CR^2$, and $R^1$ and $R^2$ can be independently H, alkyl, alkoxy, aryl, aryloxy, heteroaryl, heteroaryloxy, cross-linkable moiety, or oligo (ethylene glycol).

One aspect of the present invention includes the use of the semiconducting polymers and the conjugates described herein in devices such as a solar cell, an optical device, an electroluminescent device, a photovoltaic cell, semiconducting cell, or photodiode. Another aspect of the present invention includes the use of the conjugates of the semiconducting polymers described herein in a solar cell, an optical device, an electroluminescent device, a photovoltaic cell, semiconducting cell, photodiode or polymeric field effect transistors.

A method of incorporating the semiconducting polymers described herein onto a substrate comprises dissolving one or more of the polymers described herein with a fullerene derivative in a solvent and applying the resulting composite onto a substrate.

The one or more of the polymers can be co-dissolved with a fullerene derivative in 1,2-dichlorobenzene, chlorobenzene, chloroform, or toluene, for example, in a 1:1 weight ratio, respectively. 1,8-diiodooctance can also be used in combination with above-mentioned solvents. Polymers involving LY-12, LY-14, or LY-18 (described below) can be in concentrations in a range of about 8 to about 12 mg/ml or any combination or subcombination therein. They can also be about 10 mg/ml. Polymers involving LY-15, LY-16, or LY-17 (described below) can be in concentrations in a range of about 10 to about 15 mg/ml or any combination or subcombination therein. They can also be about 13 mg/ml. LY-15, LY-16, and LY-17 can be dissolved in a combination of 3% by volume of 1,8-diiodooctance and 1,2-dichlorobenzene. From about 2% to about 4% by volume of 1,8-diiodooctance can be mixed with 1,2-dichlorobenzene.

The polymer/fullerene composite can then be applied onto a substrate. Suitable substrates such as Indium Tin Oxide (ITO)-coated glass that are known in the art can be used. The composite can be applied onto the substrate using any variety of processes suitable for layer application or casting. Spin casting can be used to apply a thin layer or film of the composite blend onto a substrate. The layer of composite blend can be from about 80 nm to about 150 nm thick. Layer thickness will vary depending on the application of the composite blend and the substrate. Therefore, provided herein is a photovoltaic film comprising a semiconducting polymer as described herein with a fullerene derivative.

Semiconducting polymers described herein can have alternating thieno[3,4-b]thiophene and benzodithiophene units. The physical properties of these polymers can be finely tuned for photovoltaic application. The HOMO energy levels of the polymer can be lowered by substituting alkoxy side chains to the less electron donating alkyl chains in LY-15 or introducing electron withdrawing fluorine into the polymer backbone in LY-16, leading to significant increase in Voc (28%) for polymer solar cells. The side chains and substitute groups also affect polymer's absorption and hole mobility, as well as the miscibility with fulleride, all influencing polymer solar cell performances. Films prepared from mixed solvent exhibit finely distributed polymer/fulleride interpenetrating network and significantly enhanced solar cell conversion efficiency. A power conversion efficiency over 6% can be achieved in solar cells based on fluorinated LY-16/PC61BM composite films prepared from mixed solvents.

Throughout this specification, various indications have been given as to preferred and alternative embodiments of the invention. However, it should be understood that the invention is not limited to any one of these. It is therefore intended that the foregoing detailed description be regarded as illustrative rather than limiting, and that it be understood that it is the appended claims, including all equivalents, that are intended to define the spirit and scope of this invention.

EXAMPLES

Monomer Synthesis

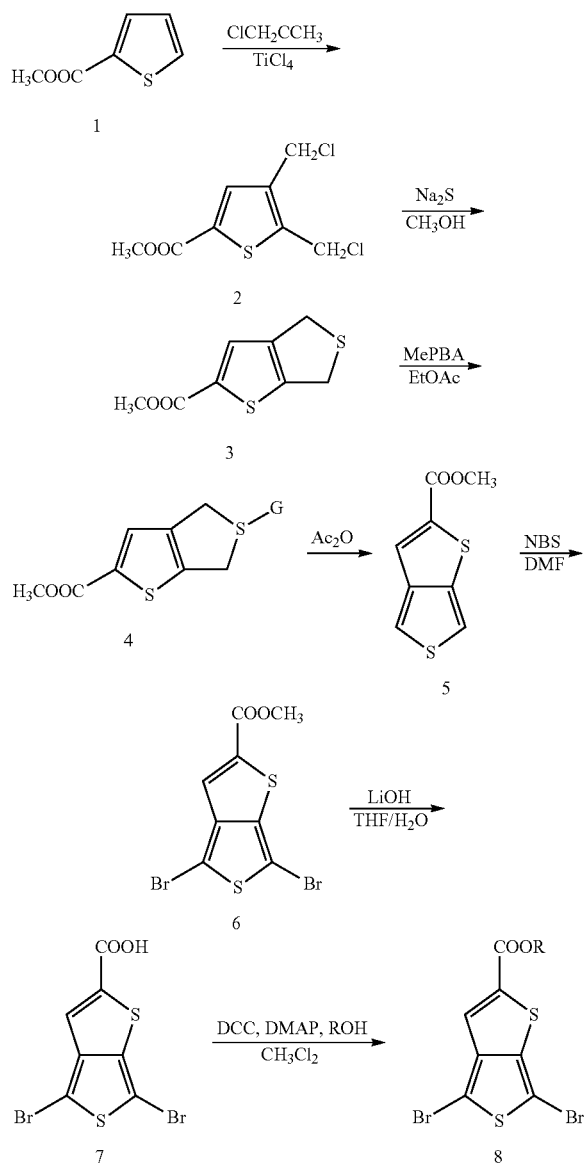

4,5-Bis-chloromethyl-thiophene-2-carboxylic acid methyl ester (2): To a mixture of 4.0 g (28 mmol) of (1) and 11.0 g (136 mmol) of chloromethyl methyl ether was added dropwise 8.4 g (42 mmol) of TiCl$_4$ in an ice-water bath, and the mixture was stirred for 5 h at RT after the addition. 50 mL CH$_2$Cl$_2$ was added, and the reaction mixture was poured to ice-water. The organic phase was washed with brine, dried and evaporated in vacuo. Recrystallization of the residue from hexane yield the title product as colorless needles 5.5 g (82%). $^1$HNMR (CDCl$_3$): δ3.89 (3H, s), 4.60 (2H, s), 4.79 (2H, s), 7.72 (1H, s). $^{13}$CNMR (CDCl$_3$): δ 37.07, 37.29, 52.44, 132.85, 134.83, 137.04, 161.85.

4,6-Dihydro-thieno[3,4-b]thiophene-2-carboxylic acid methyl ester (3): A solution of 4.8 g (20 mmol) (2) in 240 mL methanol was heated up and kept mild boiling. Sodium sulfide solution (1.7 g, 22 mmol) in 160 mL methanol was added dropwise in 2 h. After cooling of the reaction mixture, the precipitate was filtered off. The solvent was removed by evaporation and the residue was washed by water. Column chromatography on silica gel using dichloromethane yielded the pure title compound as a white solid 2.0 g (50%). $^1$HNMR (CDCl$_3$): δ 3.87 (3H, s), 4.05-4.06 (2H, t, J=3 Hz), 4.19-4.20 (2H, t, J=3 Hz), 7.48 (1H, s). $^{13}$CNMR (CDCl$_3$): 633.12, 33.47, 52.19, 127.90, 137.30, 143.90, 146.64, 162.51.

Methyl thieno[3,4-b]thiophene-2-carboxylate (5): A solution of 2.0 g (10 mmol) (3) in 30 mL ethyl acetate was stirred and cooled down in dry ice bath. MCPBA (1.75 g, 10 mmol) in 30 mL ethyl acetate was added dropwise to the reaction solution. After the addition, the mixture was kept stirring for overnight. Then the solvent was removed by evaporation and the residue contained a crude product of (4) and 3-chlorobenzoic acid.

The residue was refluxed in acetic anhydride for 2.5 h. The mixture was cooled down and the solvent was removed by evaporation. The residue was purified by flash chromatography on silica gel to give crude product of (5) 1.62 g (82%). $^1$HNMR (CDCl$_3$): δ 3.90 (3H, s), 7.29-7.30 (1H, d, J=3 Hz), 7.60-7.61 (1H, d, J=3 Hz), 7.71 (1H, s).

4,6-dibromothieno[3,4-b]thiophene-2-carboxylic acid (7): To a solution of 1.20 g (6.0 mmol) (5) in 15 mL DMF was added dropwise a solution of NBS (2.70 g, 15.0 mmol) in 15 mL DMF under nitrogen protection at dark. The reaction mixture was heated up to 40° C. and kept stirring for 24 h. Then it was cooled down, poured to saturated sodium sulfite solution at ice-water bath, and extracted with dichloromethane. The organic phase was collected and dried by sodium sulfate. Removal of the solvent, and column purification on silica get using dichloromethane/hexane mix fluent yielded the target product (6).

The free carboxylic acid (7) was obtained upon hydrolyzing the ester (6) by refluxing overnight with lithium hydroxide in THF/H$_2$O solution, followed by acidification in 1 N HCl solution. $^1$HNMR ((CD$_3$)$_2$SO): δ 7.73 (1H, s), 13.46 (1H, s). MS (EI): Calcd, 339.8. found (M+1)$^+$, 340.7.

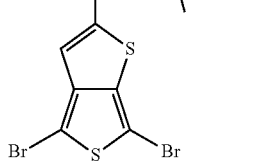

B-1

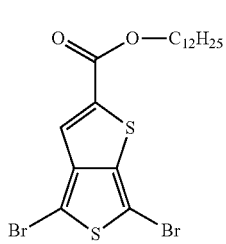

B-2

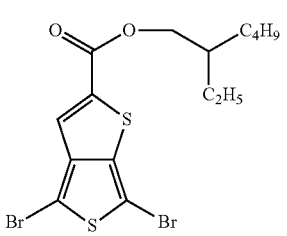

Dodecyl 4,6-dibromothieno[3,4-b]thiophene-2-carboxylate (8-1): 0.68 g (2.0 mmol) of 6, 0.50 g (2.4 mmol) DCC, 84 mg (0.69 mmol) DMAP were added to a 25 mL round bottom flask with 10 mL $CH_2Cl_2$. 1.86 g (10.0 mmol) of ROH (dodecan-1-ol) was added to the flask and then kept stirring for 20 h under $N_2$ protection. The reaction mixture was poured to 60 mL water and extracted with $CH_2Cl_2$. The organic phase was dried by sodium sulfate and the solvent was removed. Column chromatography on silica gel using hexane/$CH_2Cl_2$=4/1 yielded the pure title compound as light orange solid 0.75 g (74%). $^1$HNMR (CDCl$_3$): δ 0.86-0.89 (3H, t, J=7 Hz), 1.20-1.45 (18H, m), 1.74-1.77 (2H, m), 4.30-4.33 (2H, t, J=7 Hz), 7.54 (1H, s).

2'-Methyltetradecyl-2'4,6-dibromothieno[3,4-b]thiophene-2-carboxylate (8-2): 0.68 g (2.0 mmol) of 8, 0.50 g (2.4 mmol) DCC, 84 mg (0.69 mmol) DMAP were added to a 10 mL round bottom flask with 5 mL $CH_2Cl_2$. 2.28 g (10.0 mmol) of 2-methyltetradecan-2-ol was added to the flask and then kept stirring for 20 h under $N_2$ protection. The reaction mixture was poured to 30 mL water and extracted with $CH_2Cl_2$. The organic phase was dried by sodium sulfate and the solvent was removed. Column chromatography on silica gel using hexane/$CH_2Cl_2$=4/1 yielded the pure title compound as light orange solid 0.63 g (72%). δ 0.86-0.89 (3H, t, J=7 Hz), 1.24-1.40 (12H, m), 1.56 (6H, s), 1.83-1.87 (2H, m), 7.44 (1H, s).

2'-Ethylhexyl 4,6-dibromothieno[3,4-b]thiophene-2-carboxylate (8-3): 0.68 g (2.0 mmol) of 8, 0.50 g (2.4 mmol) DCC, 84 mg (0.69 mmol) DMAP were added to a 10 mL round bottom flask with 5 mL $CH_2Cl_2$. 1.3 g (10.0 mmol) of 2-methyltetradecan-2-ol was added to the flask and then kept stirring for 20 h under $N_2$ protection. The reaction mixture was poured to 30 mL water and extracted with $CH_2Cl_2$. The organic phase was dried by sodium sulfate and the solvent was removed. Column chromatography on silica gel using hexane/$CH_2Cl_2$=4/1 yielded the pure title compound as light orange solid 0.63 g (72%). δ 0.90-0.96 (6H, m, J), 1.32-1.46 (8H, m), 1.66-1.75 (1H, m), 4.21-4.27 (2H, m), 7.53 (1H, s).

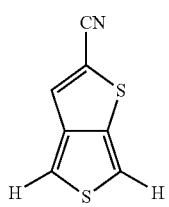

M1

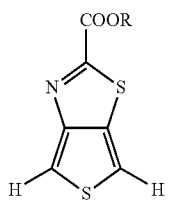

M2

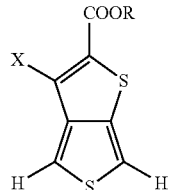

M3, X = F
M4, X = CN

Synthesis of other electronegative thieno [3,4-b] thiophene monomers. To further lower the HOMO energy level in the polymers, we propose the synthesis of several monomers that are more electronegative based on ester substituted thieno [3,4-b]thiophene. M1 is replacing the carboxylic ester with a cyanide group, cyanide is more electronegative than an ester. M2 is to change the thiophene ring to a thiazole ring, a thaizole is more electronegative because of the nitrogen. The last two (M3, M4) are introducing a more electron withdrawing functional group in the proton position. On group would be fluorine and the other would be cyanide. Synthesis of these monomers is outlined below.

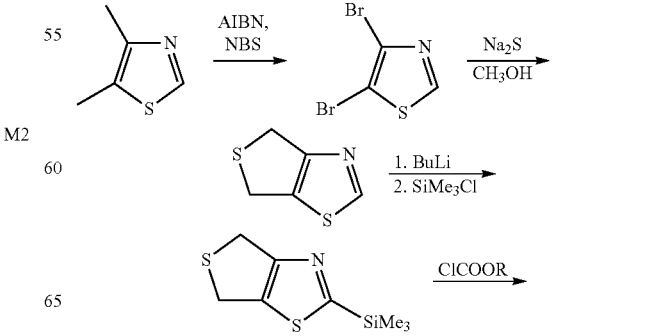

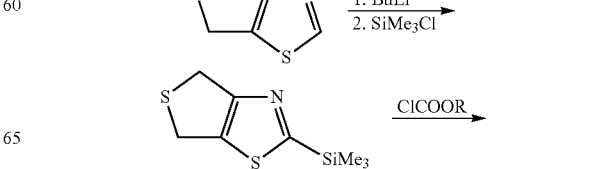

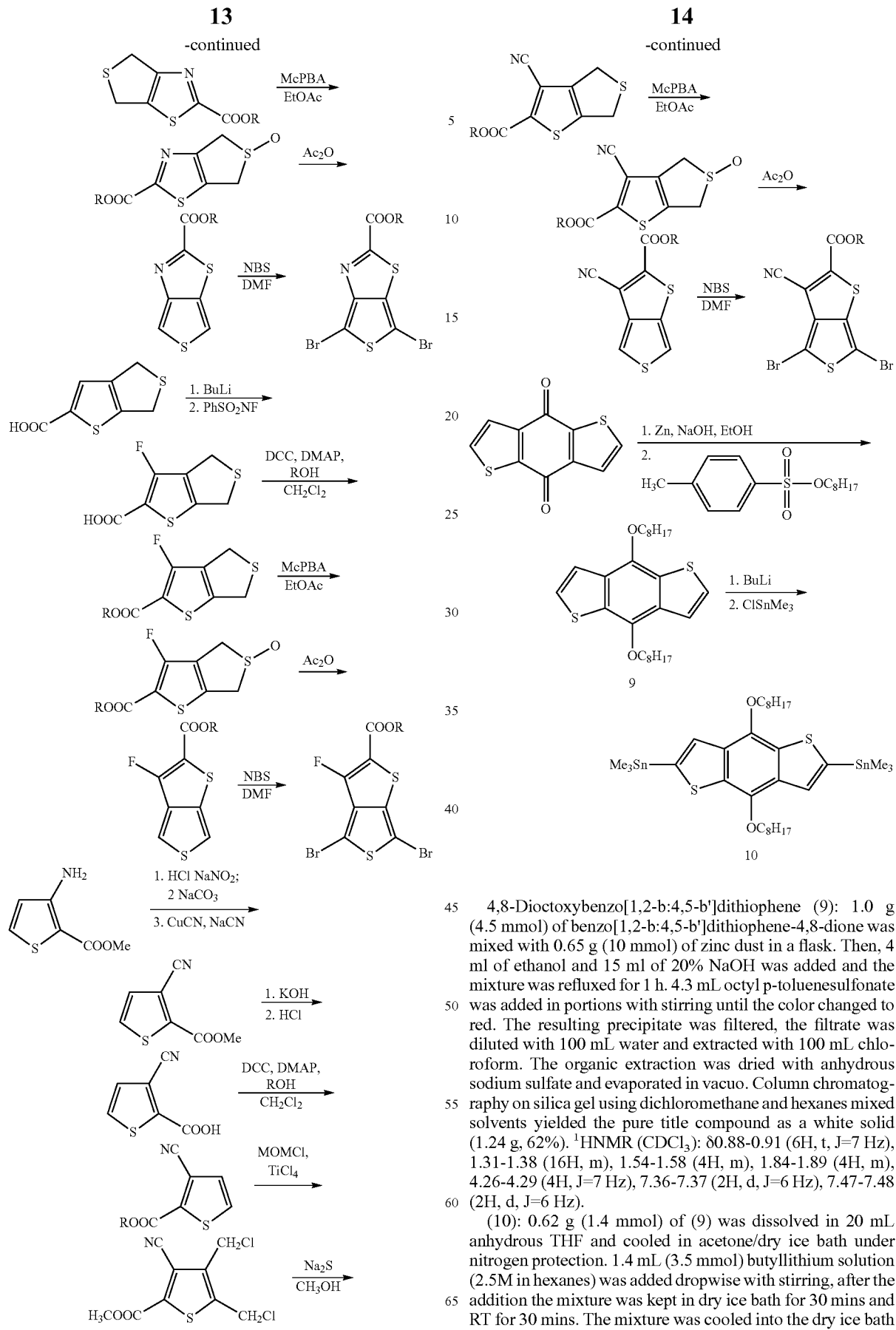

4,8-Dioctoxybenzo[1,2-b:4,5-b']dithiophene (9): 1.0 g (4.5 mmol) of benzo[1,2-b:4,5-b']dithiophene-4,8-dione was mixed with 0.65 g (10 mmol) of zinc dust in a flask. Then, 4 ml of ethanol and 15 ml of 20% NaOH was added and the mixture was refluxed for 1 h. 4.3 mL octyl p-toluenesulfonate was added in portions with stirring until the color changed to red. The resulting precipitate was filtered, the filtrate was diluted with 100 mL water and extracted with 100 mL chloroform. The organic extraction was dried with anhydrous sodium sulfate and evaporated in vacuo. Column chromatography on silica gel using dichloromethane and hexanes mixed solvents yielded the pure title compound as a white solid (1.24 g, 62%). $^1$HNMR (CDCl$_3$): δ0.88-0.91 (6H, t, J=7 Hz), 1.31-1.38 (16H, m), 1.54-1.58 (4H, m), 1.84-1.89 (4H, m), 4.26-4.29 (4H, J=7 Hz), 7.36-7.37 (2H, d, J=6 Hz), 7.47-7.48 (2H, d, J=6 Hz).

(10): 0.62 g (1.4 mmol) of (9) was dissolved in 20 mL anhydrous THF and cooled in acetone/dry ice bath under nitrogen protection. 1.4 mL (3.5 mmol) butyllithium solution (2.5M in hexanes) was added dropwise with stirring, after the addition the mixture was kept in dry ice bath for 30 mins and RT for 30 mins. The mixture was cooled into the dry ice bath and 4.2 mL (4.2 mmol) trimethyltin chloride solution (1M in hexanes) was added and kept stirring at RT for overnight. The mixture was quenched with 50 mL water and extracted with hexanes. The organic extraction was dried with anhydrous sodium sulfate and evaporated in vacuo. Recrystallization of the residue from isopropanol yields the title product as colorless needles 0.70 g (65%). $^1$HNMR (CDCl$_3$): δ 0.44 (18H, s), 0.88-0.91 (6H, t, J=7 Hz), 1.31-1.38 (16H, m), 1.54-1.58 (4H, m), 1.86-1.90 (4H, m), 4.28-4.31 (4H, J=7 Hz), 7.51 (2H, s).

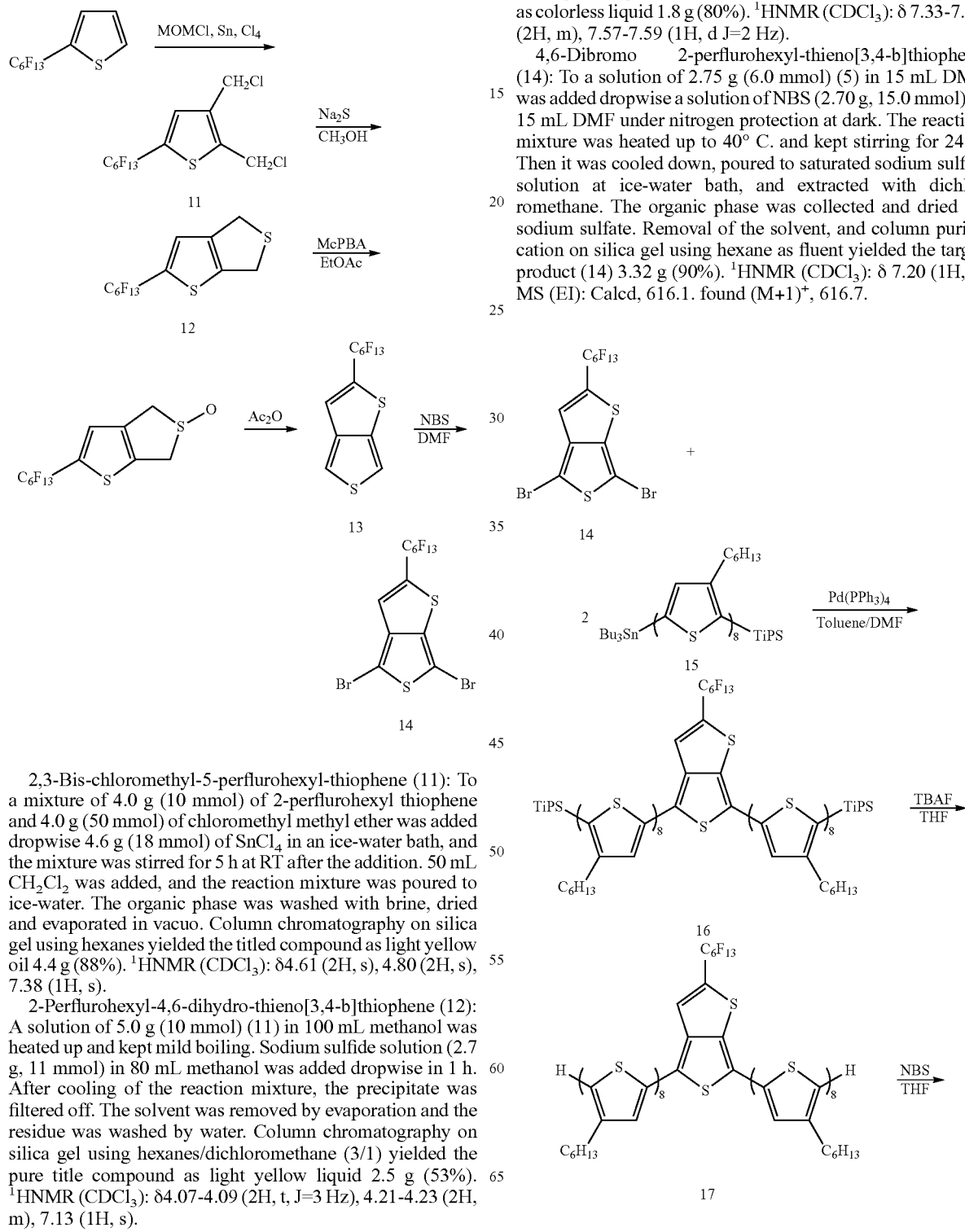

2,3-Bis-chloromethyl-5-perflurohexyl-thiophene (11): To a mixture of 4.0 g (10 mmol) of 2-perfluorohexyl thiophene and 4.0 g (50 mmol) of chloromethyl methyl ether was added dropwise 4.6 g (18 mmol) of SnCl$_4$ in an ice-water bath, and the mixture was stirred for 5 h at RT after the addition. 50 mL CH$_2$Cl$_2$ was added, and the reaction mixture was poured to ice-water. The organic phase was washed with brine, dried and evaporated in vacuo. Column chromatography on silica gel using hexanes yielded the titled compound as light yellow oil 4.4 g (88%). $^1$HNMR (CDCl$_3$): δ4.61 (2H, s), 4.80 (2H, s), 7.38 (1H, s).

2-Perflurohexyl-4,6-dihydro-thieno[3,4-b]thiophene (12): A solution of 5.0 g (10 mmol) (11) in 100 mL methanol was heated up and kept mild boiling. Sodium sulfide solution (2.7 g, 11 mmol) in 80 mL methanol was added dropwise in 1 h. After cooling of the reaction mixture, the precipitate was filtered off. The solvent was removed by evaporation and the residue was washed by water. Column chromatography on silica gel using hexanes/dichloromethane (3/1) yielded the pure title compound as light yellow liquid 2.5 g (53%). $^1$HNMR (CDCl$_3$): δ4.07-4.09 (2H, t, J=3 Hz), 4.21-4.23 (2H, m), 7.13 (1H, s).

2-Perflurohexyl-thieno[3,4-b]thiophene (13): A solution of 2.3 g (5.0 mmol) (12) in 40 mL ethyl acetate was cooled in a dry ice bath, then 1.1 g (5.0 mmol) 3-Chloroperbenzoic acid in 20 mL ethyl acetate was added dropwise. After the addition, the mixture was kept stirring in dry ice bath for 2 h, then RT 6 h. Removal of solvent under vacuum produced a white solid. The obtained solid was refluxed in 20 mL acetic anhydride for 2 h. Then the mixture was cooled down and solvent was removed under vacuum. Column chromatography on silica gel using hexanes as fluent yielded the title compound as colorless liquid 1.8 g (80%). $^1$HNMR (CDCl$_3$): δ 7.33-7.36 (2H, m), 7.57-7.59 (1H, d J=2 Hz).

4,6-Dibromo 2-perfluorohexyl-thieno[3,4-b]thiophene (14): To a solution of 2.75 g (6.0 mmol) (5) in 15 mL DMF was added dropwise a solution of NBS (2.70 g, 15.0 mmol) in 15 mL DMF under nitrogen protection at dark. The reaction mixture was heated up to 40° C. and kept stirring for 24 h. Then it was cooled down, poured to saturated sodium sulfite solution at ice-water bath, and extracted with dichloromethane. The organic phase was collected and dried by sodium sulfate. Removal of the solvent, and column purification on silica gel using hexane as fluent yielded the target product (14) 3.32 g (90%). $^1$HNMR (CDCl$_3$): δ 7.20 (1H, s) MS (EI): Calcd, 616.1. found (M+1)$^+$, 616.7.

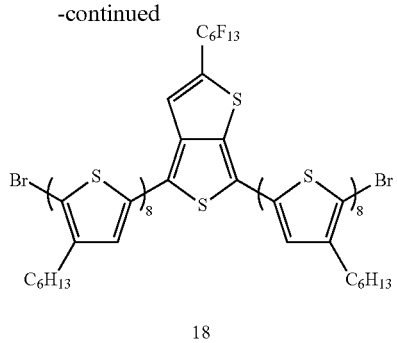

18

Oligomer (18): 331 mg (0.50 mmol) of monomer 14 was weighted into a 25 mL round-bottom flask. 2.13 g (1.20 mmol) Tributylstannyl octithiophene and 25 mg of Pd(PPh$_3$)$_4$ were added. The flask was subjected to 3 successive cycles of evacuation followed by refilling with argon. Then, 4 mL anhydrous DMF and 16 mL anhydrous toluene were added via syringe. The reaction was carried out at 120° C. for 24 h. The raw product (16) was collected by precipitating in methanol and the precipitate was dissolved in 20 mL THF and cooled in dry ice bath. 1.8 mL of 1M TBAF solution was added dropwise and kept stirring in dry ice bath for 1 h then RT for overnight. The raw product (17) was collected by precipitating in hexanes. The product was further purified by column chromatography on silica gel using hexanes/methylene chloride as fluent yielded the title compound 1.09 g (70%). $^1$HNMR (CDCl$_3$): δ 0.86-0.91 (48H, m), 1.26-1.44 (96H, m), 1.63-1.71 (32H, m), 2.55-2.65 (4H, t, J=8 Hz), 2.73-2.82 (28H, m), 6.90 (1H, s), 6.96-7.00 (11H, m), 7.02-7.03 (2H, d, J=4 Hz), 7.07 (1H, s), 7.11 (1H, s), 7.61 (1H, s).

To a solution of 0.93 g (0.30 mmol) oligomer (17) in 30 mL THF was added dropwise a solution of NBS (0.133 g, 0.75 mmol) in 5 mL THF under nitrogen protection at dark. The reaction mixture was kept stirring for 24 h. The raw product (18) was collected by precipitating in hexanes. The product was further purified by column chromatography on silica gel using hexanes/methylenechloride as fluent yielded the title compound 0.83 g (85%). $^1$HNMR (CDCl$_3$): δ 0.90-0.91 (48H, m), 1.25-1.54 (96H, m), 1.63-1.72 (32H, m), 2.55-2.59 (4H, t, J=8 Hz), 2.73-2.80 (28H, m), 6.69 (2H, s), 6.82-7.11 (12H, m), 7.61 (1H, s).

Polymer Synthesis

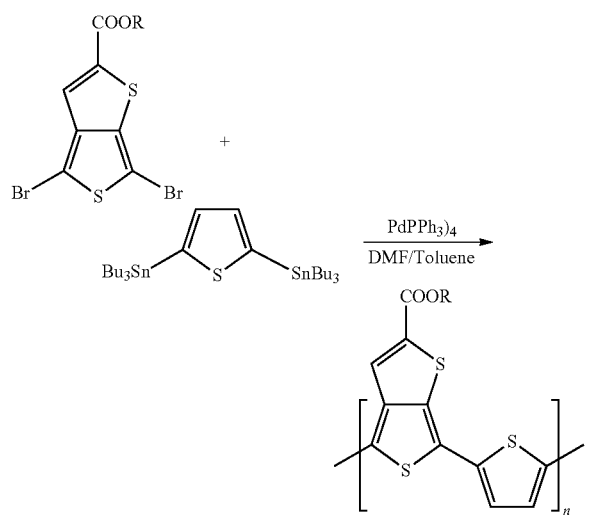

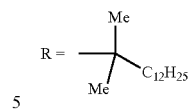

2'-Methyltetradecyl-2'4,6-dibromothieno[3,4-b]thiophene-2-carboxylate (276 mg, 0.50 mmol) was weighted into a 25 mL round-bottom flask. 331 mg (0.50 mmol) 2,5-Bis(tributylstannyl)thiophene and 25 mg of Pd(PPh$_3$)$_4$ were added. The flask was subjected to 3 successive cycles of evacuation followed by refilling with argon. Then, 2 mL anhydrous DMF and 8 mL anhydrous toluene were added via syringe. The polymerization was carried out at 120° C. for 24 h. The raw product was collected by precipitating in methanol and the precipitate was dissolved in chloroform, filtered with Celite to remove the metal catalyst. The final polymers were obtained by precipitating in hexanes, and drying in vacuum for 12 h, got solid 142 mg (60%). $^1$HNMR (CDCl$_3$): δ 0.80-1.00 (3H, br), 1.00-1.80 (26H, br, m) 1.82-2.10 (6H, br), 7.28-7.40 (2H, br), 7.58-7.70 (1H, br). GPC: Mw (98×10$^3$ g/mol), PDI (1.76).

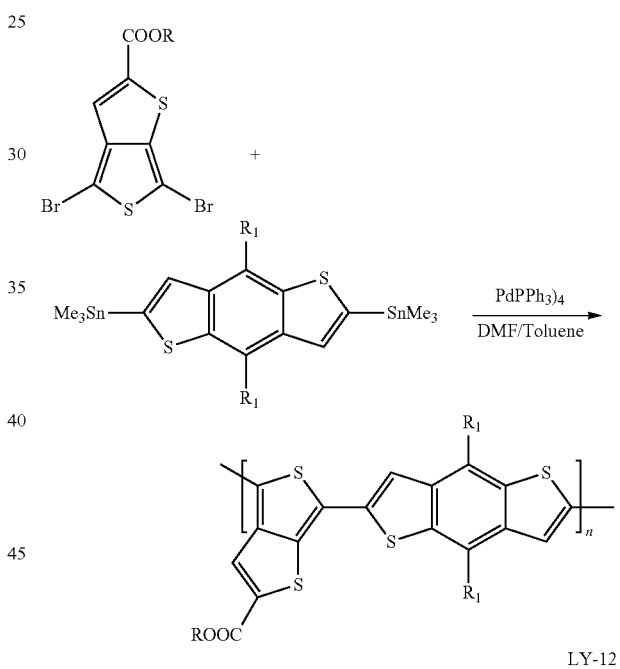

LY-12: Monomer(8-2) (255 mg, 0.50 mmol) was weighted into a 25 mL round-bottom flask. Bis(trimethylstannyl)benzodithiophene (386 mg, 0.50 mmol) and Pd(PPh$_3$)$_4$ (25 mg) were added. The flask was subjected to 3 successive cycles of vacuum followed by refilling with argon. Then, anhydrous DMF (2 mL) and anhydrous toluene (8 mL) were added via a syringe. The polymerization was carried out at 120° C. for 12 h under nitrogen protection. The raw product was collected by precipitating in methanol. The precipitate was dissolved in chloroform, filtered with Celite to remove the metal catalyst. The final polymers were obtained by precipitating in hexanes, and drying in vacuum for 12 h, get solid 338 mg (85%). $^1$HNMR (CDCl$_2$CDCl$_2$): δ 0.70-2.40 (53H, br), 3.82-4.83 (6H, br), 6.70-7.90 (3H, br). GPC: Mw (23×10$^3$ g/mol), PDI (1.29).

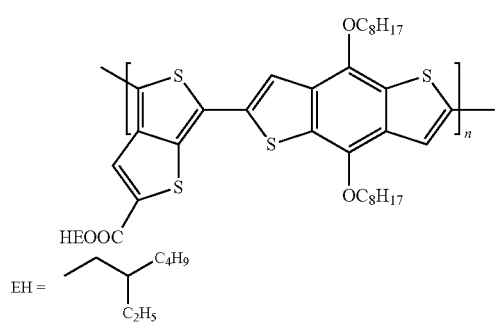

LY-14

LY-14: Polymer was synthesized by similar method as LY-12. Monomer(8-3) (227 mg, 0.50 mmol) was weighted into a 25 mL round-bottom flask. Bis(trimethylstannyl)benzodithiophene (386 mg, 0.50 mmol) and Pd(PPh$_3$)$_4$ (25 mg) were added. The flask was subjected to 3 successive cycles of vacuum followed by refilling with argon. Then, anhydrous DMF (2 mL) and anhydrous toluene (8 mL) were added via a syrnge. The polymerization was carried out at 120° C. for 12 h under nitrogen protection. The raw product was collected by precipitating in methanol. The precipitate was dissolved in chloroform, filtered with Celite to remove the metal catalyst. The final polymers were obtained by precipitating in hexanes, and drying in vacuum for 12 h, get solid 296 mg (80%). $^1$HNMR (CDCl$_2$CDCl$_2$): δ 0.70-2.42 (45H, br), 3.90-4.80 (6H, br), 6.70-8.00 (3H, br).GPC: Mw (27×10$^3$ g/mol), PDI (1.67).

A device was made with the polymer LY-14 and an electron acceptor in a 1:1 mass ratio, 14 mg/mL polymer solution in chlorobenzene. The current density versus voltage is shown in FIG. 1. $J_{sc}$=17.3 mA/cm$^2$, $V_{oc}$=0.60 V, FF=0.53, PCE=5.5%.

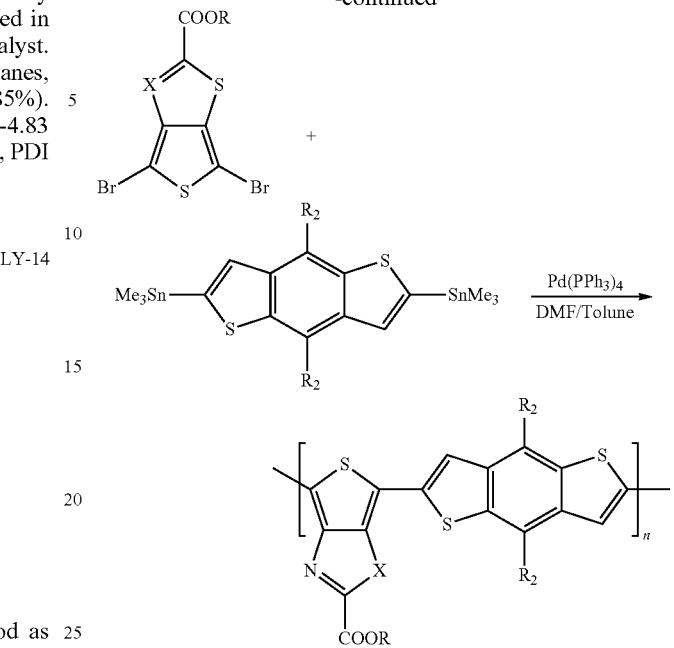

Synthesis of other electronegative thieno [3,4-b] thiophene polymers. The dibrominated monomers will then undergo polymerization with ditin monomers through a palladium catalyzed Stille polycondensation reaction.

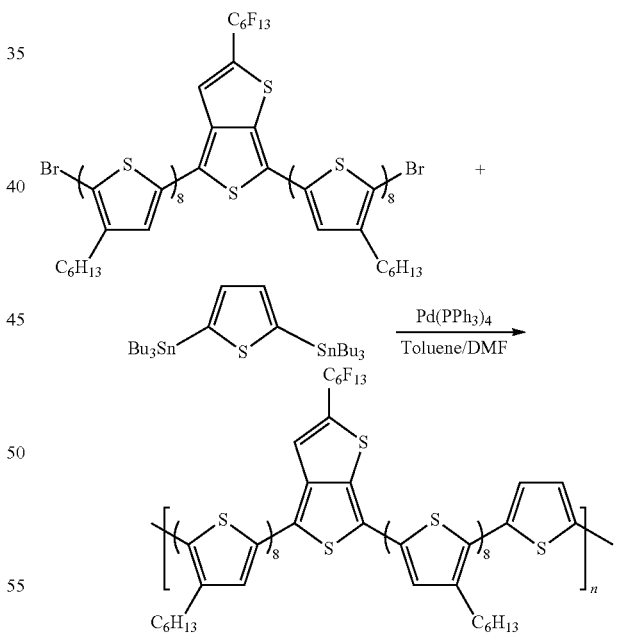

Polymer was synthesized by a similar procedure described above. Oligomer 18 (327 mg, 0.10 mmol) was weighted into a 25 mL round-bottom flask. 66 mg (0.10 mmol) 2,5-Bis(tributylstannyl)thiophene and 5 mg of Pd(PPh$_3$)$_4$ were added. The flask was subjected to 3 successive cycles of evacuation followed by refilling with argon. Then, 2 mL anhydrous DMF and 8 mL anhydrous toluene were added via syringe. The polymerization was carried out at 120° C. for 24 h. The raw product was collected by precipitating in methanol

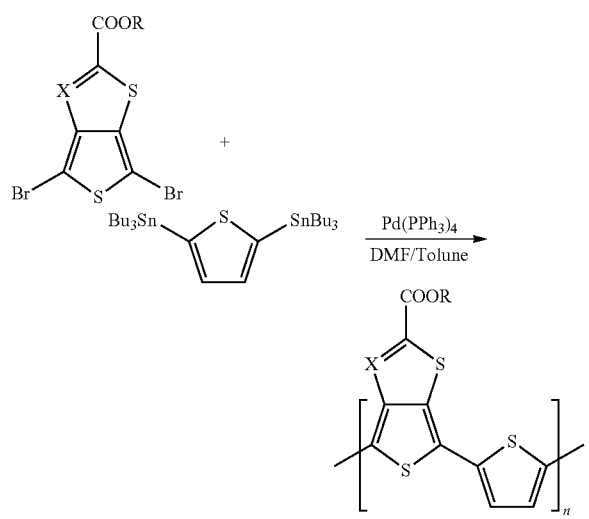

and the precipitate was dissolved in chloroform, filtered with Celite to remove the metal catalyst. The final polymers were obtained by precipitating in hexanes, and drying in vacuum for 12 h, got solid 288 mg (90%). $^1$HNMR (CDCl$_3$): δ 0.80-0.91 (48H, m), 1.20-1.56 (96H, m), 1.60-1.82 (32H, m), 2.68-2.85 (32H, m), 6.69 (2H, s), 6.90-7.13 (18H, m), 7.60 (1H, s). GPC: Mw (19×10$^3$ g/mol), PDI (1.37).

Polymer Synthesis

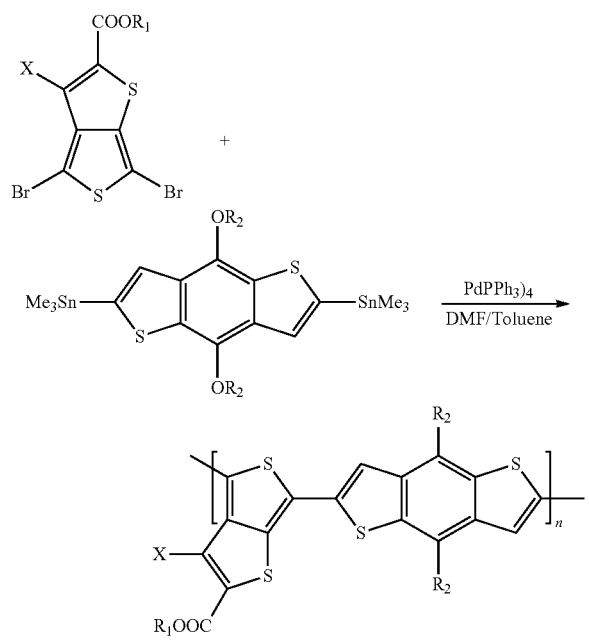

LY-12: X = H, R$_1$ = n-dodecyl, R$_2$ = n-octyloxy
LY-14: X = H, R$_1$ = 2-ethylhexyl, R$_2$ = n-octyloxy
LY-15: X = H, R$_1$ = 2-ethylhexyl, R$_2$ = n-octyl
LY-16: X = F, R$_1$ = n-octyl, R$_2$ = 2-ethylhexyloxy
LY-17: X = H, R$_1$ = n-octyl, R$_2$ = 2-ethylhexyloxy
LY-18: X = H, R$_1$ = 2-butyloctyl, R$_2$ = n-octyloxy

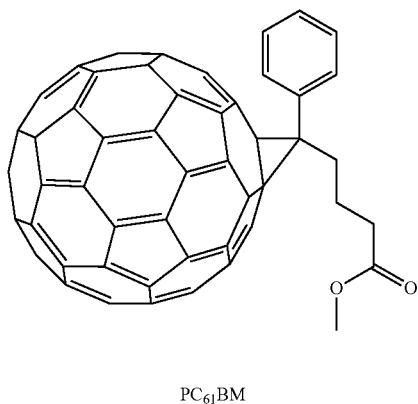

PC$_{61}$BM

LY-16: Octyl-6-dibromo-3-fluorothieno[3,4-b]thiophene-2-carboxylate (6) (236 mg, 0.50 mmol) was weighted into a 25 mL round-bottom flask. 2,6-Bistrimethyltin-4,8-Di(2-ethyl)hexyloxybenzo[1,2-b:4,5-b']dithiophene (9) (386 mg, 0.50 mmol) and Pd(PPh$_3$)$_4$ (25 mg) were added. The flask was subjected to 3 successive cycles of vacuum followed by refilling with argon. Then, anhydrous DMF (2 mL) and anhydrous toluene (8 mL) were added via a syringe. The polymerization was carried out at 120° C. for 12 h under nitrogen protection. The raw product was precipitated into methanol and collected by filtration. The precipitate was dissolved in chloroform, filtered with Celite to remove the metal catalyst. The final polymers were obtained by precipitating in hexanes, and drying in vacuum for 12 h, yielding LY-16 (309 mg, 82%). $^1$HNMR (CDCl$_2$CDCl$_2$): δ 0.80-2.40 (45H, br), 3.90-4.70 (6H, br), 7.00-7.90 (2H, br). GPC: Mw (19.3×10$^3$ g/mol), PDI (1.32).

LY-14, LY-15, LY-17 and LY-18 are synthesized according to the same procedure as LY-16 with respective monomers. The $^1$HNMR and GPC data of the polymers are listed below:

LY-14: $^1$HNMR (CDCl$_2$CDCl$_2$): δ 0.70-2.42 (45H, br), 3.90-4.80 (6H, br), 6.70-8.00 (3H, br). GPC: Mw (23.2×10$^3$ g/mol), PDI (1.38).

LY-15: $^1$HNMR (CDCl$_2$CDCl$_2$): δ 0.70-2.35 (45H, br), 2.90-3.40 (4H, br), 4.20-4.70 (2H, br), 6.70-8.20 (3H, br). GPC: Mw (23.7×103 g/mol), PDI (1.49).

LY-17: $^1$HNMR (CDC}zCDC}z): δ 0.90-2.40 (45H, br), 3.90-4.70 (6H, br), 7.00-7.60 (2H, br), 7.60-8.10 (1H, br). GPC: Mw (22.7×10$^3$ g/mol), PDI (1.41).

LY-18: $^1$HNMR (CDCl$_2$CDCl$_2$): δ 0.70-2.42 (53H, br), 3.90-4.80 (6H, br), 6.70-8.00 (3H, br). GPC: Mw (25.0×10$^3$ g/mol), PDI (1.50).

The polymerization was carried out via the Stille polycondensation reaction. The corresponding monomers were synthesized according to the following routes.

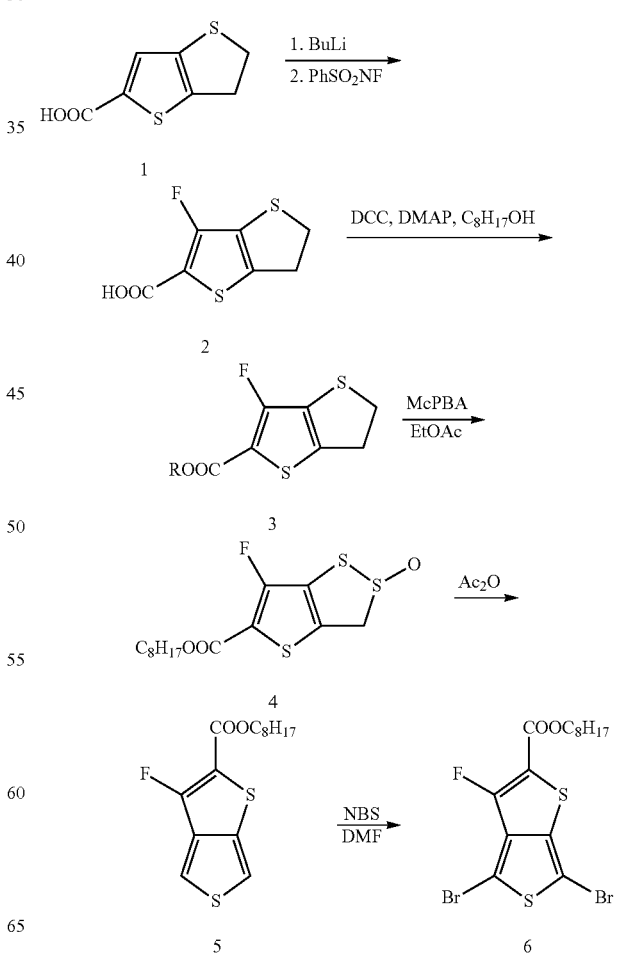

-continued

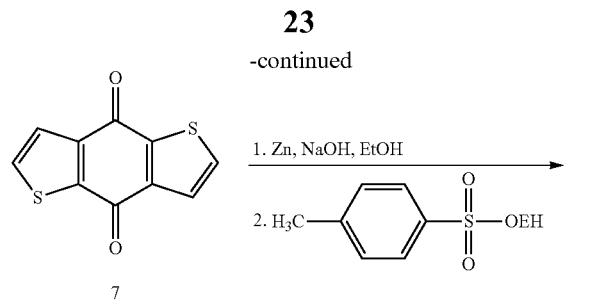
7

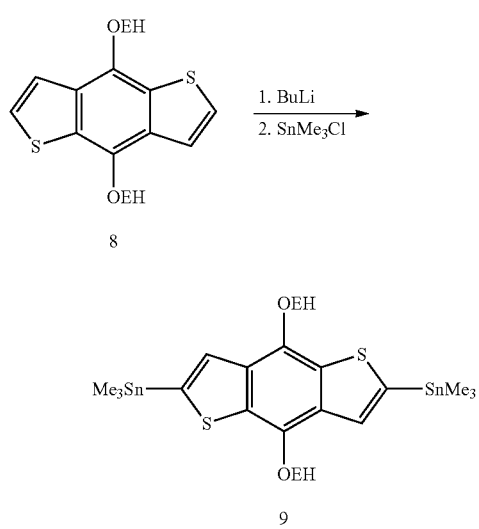
8

9

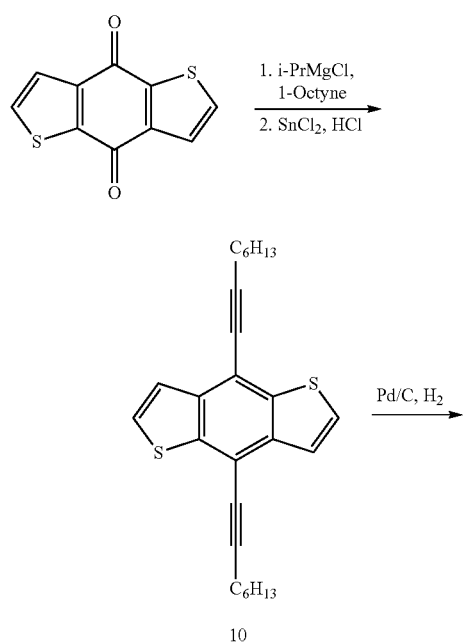
10

11

-continued

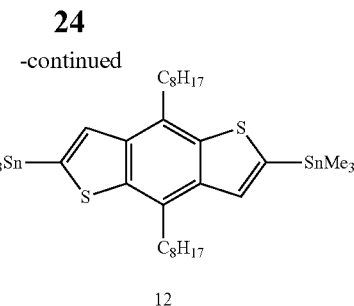
12

EH = 2-ethylhexyl

To shorten the dodecyl ester chain in LY-12, a n-octyl side chain substituted polymer was synthesized. Soluble LY-14 was synthesized with shortened and branched side chains. For comparison, a more bulky branched side chain, 2-butyloctyl was used in LY-18. The branched side chain can also be grafted to the benzodithiophene, which lead to LY-17 with two 2-ethylhexyloxy side chain attached to the benzodithiophene ring. The alkoxy groups grafted on benzodithiophene ring are strong electron-donating groups that can raise the HOMO energy level of the polymer. This will lead to the reduction in Voc, detrimental to the performance of polymer solar cells. In order to further adjust the polymer's electronic properties, LY-15 with less electron-donating alkyl chains in benzodithiophene was synthesized.

To further lower the HOMO level, a second electron withdrawing group can be introduced to the 3 position of the thieno[3,4-b]thiophene ring. Fluorine is a good candidate to functionalize the 3 position because the fluorine has a high electronegativity. The size of the fluorine atom is small, which will introduce only small steric hindrance for the configuration and packing of the polymer. The fluorinated thieno[3,4-b]thiophene was synthesized via a modified route previously reported for ester substituted thieno[3,4-b]thiophene (above scheme). The fluorine was introduced to the fused ring unit from 4,6-dihydrothieno[3,4-b]thiophene-2-carboxylic acid after deprotonation by using BuLi and reacting with PhSO2NF. The fluorinated acid was first converted to ester and then dibromosubstituted thieno[3,4-b]thiophene. Initially, we attempted to introduce fluorine atom to LY-12 ($R_1$=n-dodecyl, $R_2$=n-octyloxy). The obtained polymer exhibited poor solubility and only dissolves in dichlorobenzene over 100° C., which makes it difficult to prepare uniform films. To increase the solubility, benzodithiophene substituted with branch side chains was used and the fluorinated polymer, LY-16, was obtained.

The structures of polymers were characterized with $^1$HNMR spectroscopy, all consistent with the proposed ones. Gel permeation chromatography (GPC) studies showed that these polymers have similar weight-averaged molecular weights between 19.3-25.0 kg/mol with a relatively narrow polydispersity index (PDI) between 1.25 and 1.50. The results indicate that the changes in monomer structures did not lead to significant changes in polymerization reaction. These polymers have good solubility in chlorinated solvents, such as chloroform and chlorobenzene. Thermogravimetric analyses (TGA) indicate that the polymers are stable up to about 200° C.

Characterization $^1$HNMR spectra were recorded at 400 or 500 MHz on Bruker DRX-400 or DRX-500 spectrometers, respectively. Molecular weights and distributions of polymers were determined by using gel permeation chromatography (GPC) with a Waters Associates liquid chromatograph equipped with a Waters 510 HPLC pump, a Waters 410 differential refractometer, and a Waters 486 tunable absorbance detector. THF was used as the eluent and polystyrene as the standard. The optical absorption spectra were taken by a Hewlett-Packard 8453 UV-Vis spectrometer.

Cyclic voltammetry (CV) was used to study the electrochemical properties of the polymers. For calibration, the redox potential of ferrocene/ferrocenium (Fc/Fc$^+$) was measured in the same condition, and it's located at 0.09 V to the Ag/Ag$^+$ electrode. It is assumed that redox potential of Fc/Fc$^+$ has an absolute energy level of −4.80 eV to vacuum. The energy levels of HOMO and the lowest unoccupied molecular orbital (LUMO) were then calculated according to the following equations:

$$E_{HOMO} = -(\phi_{ox} + 4.71) \text{ (eV)}$$

$$E_{LUMO} = -(\phi_{red} + 4.71) \text{ (eV)}$$

where $\phi_{ox}$ is the onset oxidation potential vs Ag/Ag$^+$ and $\phi_{red}$ is the onset reduction potential vs Ag/Ag$^+$.

Hole mobility was measured according to a similar method described in literature, using a diode configuration of ITO/poly(ethylenedioxythiophene) doped with poly(styrenesulfonate) (PEDOT:PSS)/Polymer/Al by taking current-voltage current in the range of 0-6 V and fitting the results to a space charge limited form, the SCLC is described by:

$$J = 9 \, \epsilon_o \epsilon_r \mu V^2 / 8L^3$$

where $\epsilon_o$ is the permittivity of free space, $\epsilon_r$ is the dielectric constant of the polymer, $\mu$ is the hole mobility, V is the voltage drop across the device, and L is the polymer thickness, $V = V_{appl} - V_r - V_{bi}$, $V_{appl}$ is the applied voltage to the device, $V_r$ is the voltage drop due to contact resistance and series resistance across the electrodes, $V_{bi}$ is the built-in voltage due to the difference in work function of the two electrodes. The resistance of the device was measured using a blank configuration ITO/PEDOT:PSS/Al and was found to be about 10-20Ω. The $V_{bi}$ was deduced from the best fit of the $J^{0.5}$ versus $V_{appl}$ plot at voltages above 2.5 V and is found to be about 1.5 V. The dielectric constant, $\epsilon_r$ is assumed to be 3 in our analysis, which is a typical value for conjugated polymers. The thickness of the polymer films is measured by using AFM.

Device Fabrication

The polymers LY-12, LY-14, LY-15, LY-16, LY-17, and LY-18 were co-dissolved with PC$_{61}$BM in 1,2-dichlorobenzene (DCB) in the weight ratio of 1:1, respectively. LY-12, LY-14, and LY-15 concentrations were 10 mg/ml while LY-15, LY-16, and LY-17 concentrations were 13 mg/ml. For the last three polymer solutions, mixed solvent effect was studied with about 3% (volume) 1,8-diiodooctance to further improve the final device performance.

Indium Tin Oxide (ITO)-coated glass substrates (15! 1/sq) were cleaned stepwise in detergent, water, acetone and isopropyl alcohol under ultrasonication for 15 minutes each and subsequently dried in an oven for 5 hours. A thin layer (~30 nm) of PEDOT:PSS (Baytron P VP A1 4083) was spin-coated onto ITO surface which was pre-treated by ultraviolet ozone for 15 min. Low conductivity PEDOT:PSS was chosen to minimize measurement error from device area due to lateral conductivity of PEDOT:PSS. After being baked at 12° C. for ~20 min, the substrates were transferred into a nitrogen filled glove box(<0.1 ppm O2 & H$_2$0). A polymer/PCBM composites layer (ca.100 nm thick) was then spin-cast from the blend solutions at 1000 rpm on the ITO/PEDOT:PSS substrate without further special treatments. Then the film was transferred into thermal evaporator which is located in the same glove box. A Ca layer (25 nm) and an Al layer (80 nm) were deposited in sequence under the vacuum of 2×10$^{-6}$ Tor. The effective area of film was measured to be 0.095 cm$^2$.

Current-Voltage Measurement

The fabricated device was encapsulated in nitrogen filled glove box by UV epoxy (bought from Epoxy Technology) and cover glass. The current density-voltage (J-V) curves were measured using Keithley 2400 source-measure unit. The photocurrent was measured under AM 1.50 illumination at 100 mW/cm$^2$ under Newport Thermal Oriel 91192 1000W solar simulator (4"∴4" beam size). The light intensity was determined by a mono-silicon detector (with KG-5 visible color filter) calibrated by National Renewable Energy Laboratory (NREL) to minimize spectral mismatch.

External Quantum Efficiencies (EQEs) were measured in UCLA by using lock-in amplifier (SR830, Stanford Research Systems) with current preamplifier (SR570, Stanford Research Systems) under short circuit condition. The devices were illuminated by monochromatic light from a xenon lamp passing through a monochromator (SpectraPro-2150i, Acton Research Corporation) with a typical intensity of 10 μW. The monochromic incident beam is chopped with a mechanical chopper prior to reaching the device connected to lock-in amplifier and then focused on the testing pixel of the device. The photocurrent signal is then amplified by SR570 and detected with SR830. A calibrated mono silicon diode with known spectral response is used as a reference. Conductive atomic force microscopy measurement All CAFM measurements were done under ambient conditions using a commercial scanning probe microscope (Asylum Research, MFP-3D). Platinum-coated, contact-mode AFM cantilevers with spring constant of 0.2 N/m and tip radius of ca. 25 nm (Budget Sensors) were used to map out the hole-current of films in the dark using contact mode. The deflection set point are 0.3 V and bias voltage are −2 V for all the sample measurements, and the conditions used to prepare the films are same to make the solar cell device.

Electrochemical and Optical Properties

Figure 2:
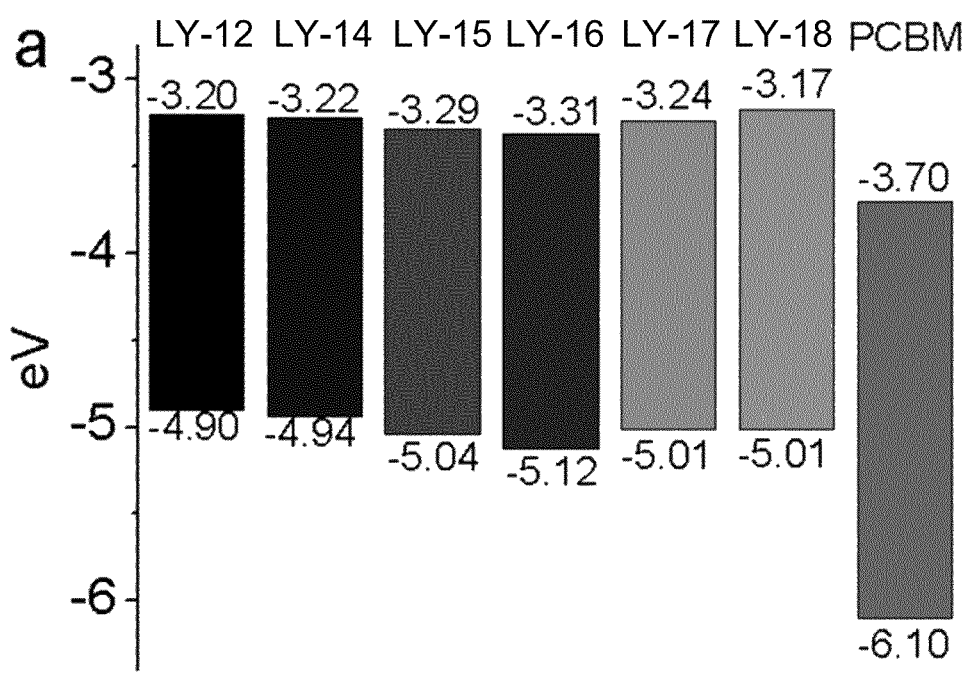
FIG. 2 is a bar graph of the HOMO and LUMO energy levels of certain polymers and fullerene described herein.

The HOMO and LUMO energy level of the polymers were determined by cyclic voltammetry (CV) and the results were summarized in FIG. 2. The HOMO energy levels of the polymers are very close except for LY-15 and LY-16. From the comparison of LY-14 and LY-15, it was noticed that the substitution of octyloxy side chain to octyl side chain lowered the HOMO energy level of the polymer from −4.94 eV to −5.04 eV. Comparing LY-16 and LY-17, polymers with same side chain patterns, it is clear that the introduction of the electron withdrawing fluorine in polymer backbone significantly lowered the HOMO level. Characteristics of the polymer absorption are summarized in the table below. All these polymers show very similar absorption spectra, the changes of the absorption peak and onset point among the polymers are within 25 nm.

| Polymers | Mw (kg/mol) | PDI | $\lambda_{peak}$ (nm) | $\lambda_{onset}$ (nm) | $E_g^{opt}$ (ev) |
|---|---|---|---|---|---|
| LY-12 | 22.9 | 1.25 | 687, 638 | 786 | 1.58 |
| LY-14 | 23.2 | 1.38 | 683, 630 | 780 | 1.59 |
| LY-15 | 23.7 | .49 | 682, 628 | 777 | 1.60 |
| LY-16 | 19.3 | 1.32 | 682, 627 | 762 | 1.63 |
| LY-18 | 22.7 | 1.41 | 677, 623 | 764 | 1.62 |
| LY-18 | 25.0 | 1.50 | 675, 630 | 768 | 1.61 |

Hole Mobility

Figure 3:
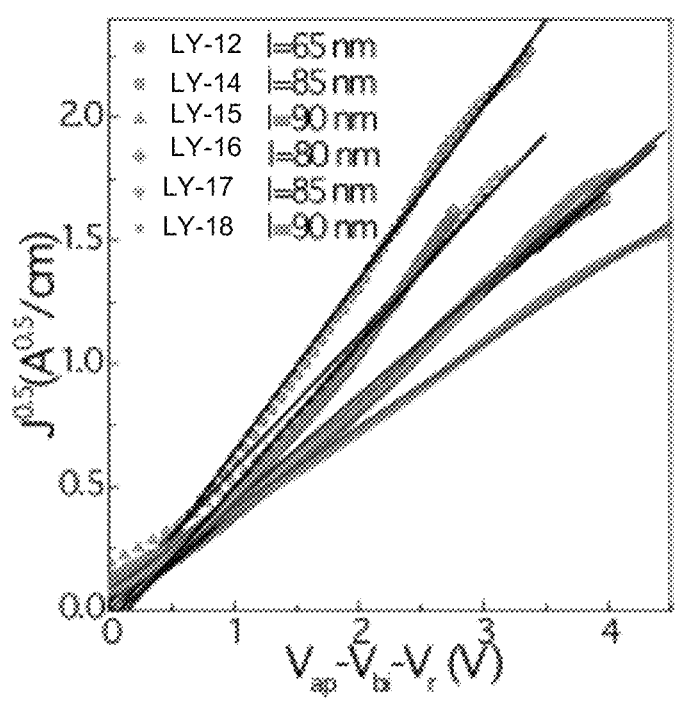
FIG. 3 is a line graph of the $J^{0.5}$ vs V plots for the polymers described herein with solid lines being fits of the data points and the thickness of the films indicated in the plots.

The hole mobility of the polymers is measured according to method based on space charge limited current (SCLC)

model, and the results are plotted in FIG. 3. The hole mobility of $4.7 \times 10^{-4}$ cm$_2$/V·s, $4.0 \times 10^{-4}$ cm$_2$/V·s, $7.1 \times 10^{-4}$ cm$_2$/V·s, $7.7 \times 10^{-4}$ cm$_2$/V·, $4.0 \times 10^{-4}$ cm$_2$/V·s, $2.6 \times 10^{-4}$ cm$_2$/V·s are found for LY-12, LY-14, LY-15, LY-16, LY-17 and LY-18 respectively. A small decrease of the polymer hole mobility is observed after the introduction of bulky branched side chains to the polymer backbones. It is expected that the bulky side chains may increase the steric hindrance for intermolecular packing, so the hole mobility decreases. This explains that the largest decrease of the hole mobility happens to LY-18, which has the most bulky 2-butyloctyl side chain on the ester group. It is interesting to note that the alkyl grafted LY-15 has higher mobility than the alkoxy grafted LY-14, though they both have similar side chain patterns. LY-16 has the largest hole mobility of 7.7×10-4 cm2/V·s among these polymers. It has been reported that there is a strong n-stacking among interaction between the electron-deficient fluorinated aromatic rings and the electron-rich non-fluorinated ones in the fluorine-substituted aromatic moieties. The increase of mobility in fluorinated LY-16 is probably due to the increase in intermolecular packing between fluorinated backbone. Detailed studies by using grazing angle x-ray diffraction are in progress to elucidate polymer structures and will be presented in the future publication.

Photovoltaic Properties

Photovoltaic properties of the polymers were investigated in solar cell structures of ITO/PEDOT:PSS/polymer:PC$_{61}$BM(1:1, % wt ratio)/Ca/Al. The polymer active layers were spin-coated from a dichlorobenzene solution. Representative characteristics of the solar cells are summarized in the table below. Generally, the bulky side chain grafted polymers show larger $V_{oc}$ than LY-12, as they have lower HOMO energy levels. The alkyl substituted LY-15 has an enhanced $V_{oc}$ compared to LY-14, which is expected from the HOMO energy level difference. The fluorinated polymer LY-16 devices showed a larger Voc than LY-17. However, except for LY-14 and LY-15, the other polymer solar cells suffer obvious decrease in short circuit current (Js) and fill factor (FF) compared to the LY-12 solar cell. Further studies by using transmission electron microscopy (TEM) indicated that the poor solar cell performances in LY-15 to LY-18 are related to the non-optimized morphology, which has a large effect on the BHJ polymer solar cell performance. The TEM images of polymer/PC$_{61}$BM blend films are shown in FIGS. 4a-4i: LY-12 (a); LY-14 (b); LY-15 (c); LY-16 (d); LY-17 (e); LY-18 (f). Polymer/PC$_{61}$BM blend films prepared from mixed solvents dichlorobenzene/diiodooctane (97/3, v/v): LY-15 (g); LY-16 (h); LY-17 (i).

The TEM images of LY-14/PC$_{61}$BM blend film shows finer features comparable to LY-12 one, which may be due to the increase in the miscibility of the polymer with PC$_{61}$BM after shortening the dodecyl side chain into 2-ethylhexyl side chain. As a result, Jsc and FF in LY-14 solar cell are slightly larger than LY-12 one. However, large domains are observed in their PC$_{61}$BM blend films of LY-17 or LY-18. The bulky side chains reduce the miscibility of polymer with PC$_{61}$BM, leading to better phase separation between polymer chains and PC$_{61}$BM molecules. As a result, the interfacial areas of charge separation in LY-17 or LY-18 are reduced and the polymer solar cell performances diminished. It is not coincident that the LY-18 has the largest feature sizes (150-200 nm) in TEM image and its solar cell performance is the worst. With the same side chain patterns as LY-17, the fluorinated LY-16 also suffer the non-optimized morphology, as shown the large features (over 100nm) in the TEM image of LY-16/PC$_{61}$BM blend film. Although LY-16 shows the lowest HOMO energy level and the largest hole mobility, its photovoltaic performance in simple polymer/PC$_{61}$BM solar cells is modest (3.10%). Comparing LY-14 and LY-15 with similar side chain patterns, LY-15 has a larger Jsc than LY-14, which is due to the increase of hole mobility in LY-15. However, the better packing ability in LY-15 may reduce its miscibility with PC$_{61}$BM, and there are a few large features (about 50 nm) in the TEM images of LY-15/PC$_{61}$BM blend film. Due to the non-optimized morphology, LY-15 solar cell suffers a slight decrease on FF compared to LY-14. But with the increase in Jsc and Voc, LY-15 devices still show 5.53% PCE.

| Polymers | Voc (V) | Jsc (mA/Cm$^2$) | FF (%) | PCE (%) |
|---|---|---|---|---|
| LY-12 | 0.58 | 12.5 | 65.4 | 4.76 |
| LY-14 | 0.60 | 12.8 | 66.3 | 5.10 |
| LY-15 | 0.74 | 13.1 | 56.8 | 5.53 |
| LY-16 | 0.76 | 9.20 | 44.5 | 3.10 |
| LY-17 | 0.68 | 10.3 | 43.1 | 3.02 |
| LY-18 | 0.62 | 7.74 | 47.0 | 2.26 |
| LY-15[a] | 0.72 | 13.9 | 58.5 | 5.85 |
| LY-16[a] | 0.74 | 13.0 | 61.4 | 5.90(6.10[b]) |
| LY-17[a] | 0.66 | 10.7 | 58.0 | 4.10 |

Figure 5A:
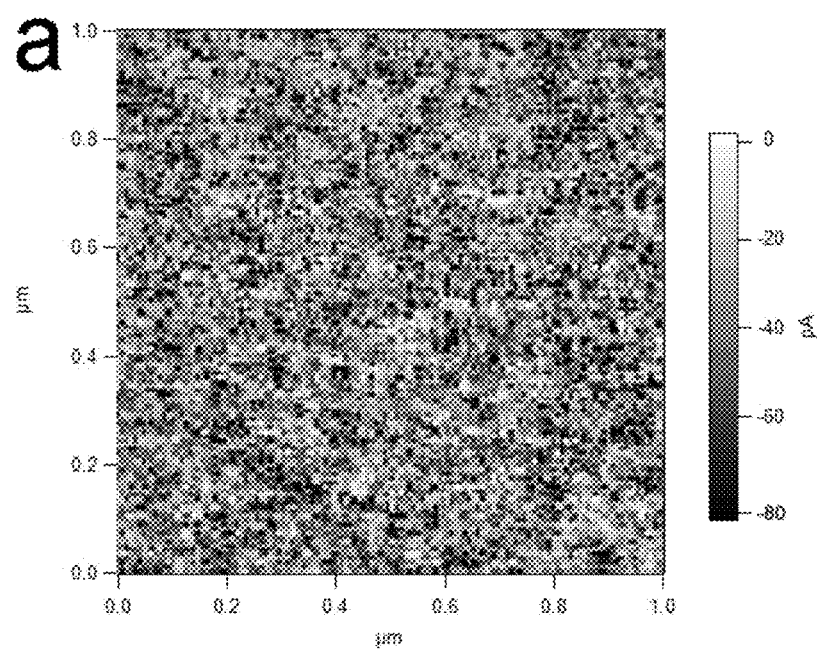
FIGS. 5a and 5b are CAFM images of polymer/fullerene blend films: LY-14 and LY-18, with the white regions in CAFM (low current) corresponding to the fullerene-rich areas, consistent with hole current images.
Figure 5B:
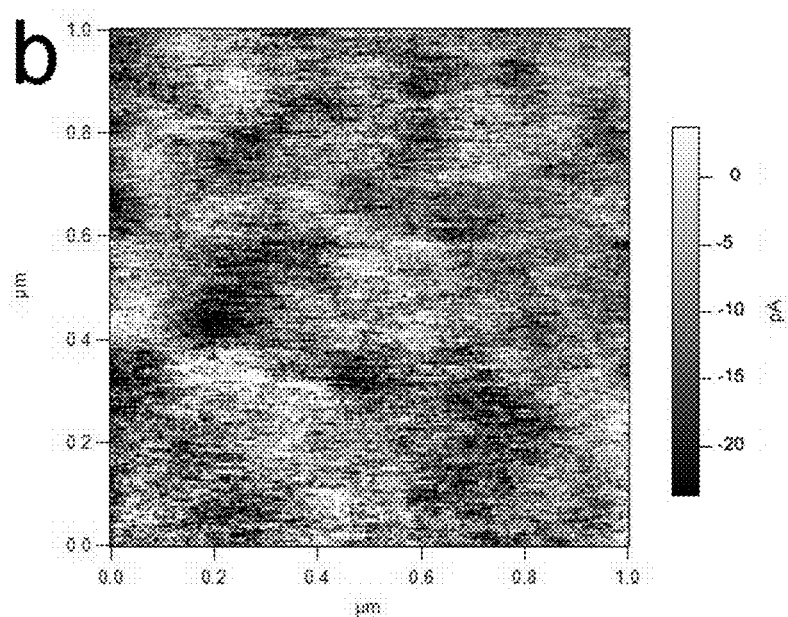

Insightful information on the effect of morphology on charge transport behaviors of composite films was obtained from studies using conductive atomic force microscopy (CAFM). The two-dimensional current maps correlate well with nanoscale domain structure observed from TEM in solar cell films. We select LY-14 and LY-18 systems as example to illustrate this point. FIGS. 5a and 5b show the CAFM current images at fixed bias voltage of −2 V for films LY-14/PC$_{61}$BM and LY-18/PC$_{61}$BM. Consistent with TEM study, we observe donor/acceptor interfaces throughout the films with interpenetrating networks of donor/acceptor material in the LY-14 film. The high hole current features (dark areas) are contributions from polymer rich domains and are distributed uniformly over whole LY-14/PC$_{61}$BM film surface, which makes the solar cells high current density. In contrast, there are low current areas in the images and largely phase separated features throughout the LY-18/PC$_{61}$BM films. The much lower current (see the difference in scale bar) of LY-18 reflects the lower hole mobility of LY-18 than LY-14.

Figures 4A, 4B, 4C:
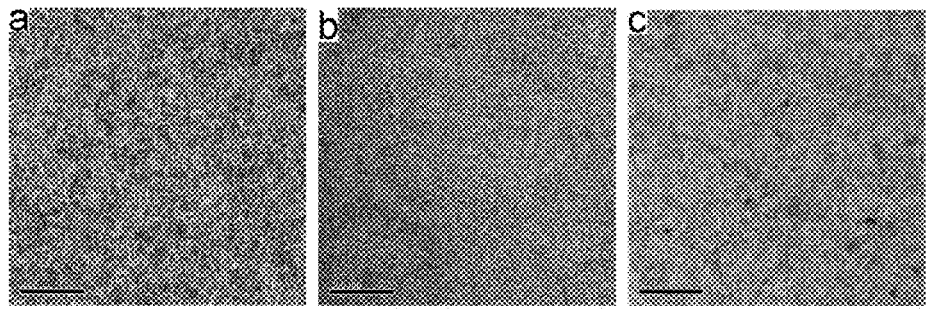
FIGS. 4a through 4i are TEM images of polymer/fullerene blend films and polymer $PC_{61}BM$ blend films prepared from mixed solvents.
Figures 4D, 4E, 4F:
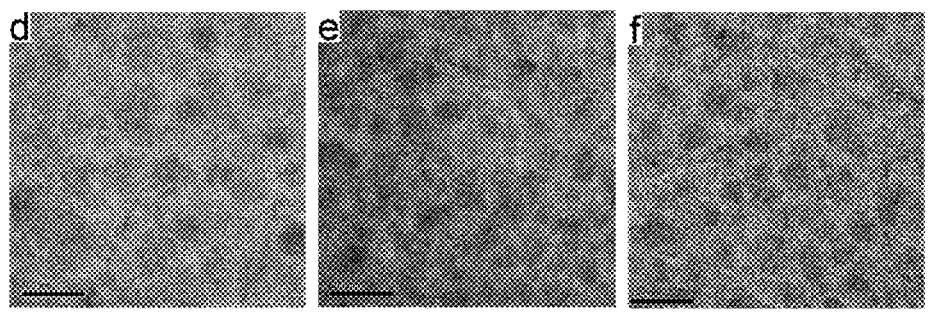
Figures 4G, 4H, 4I:
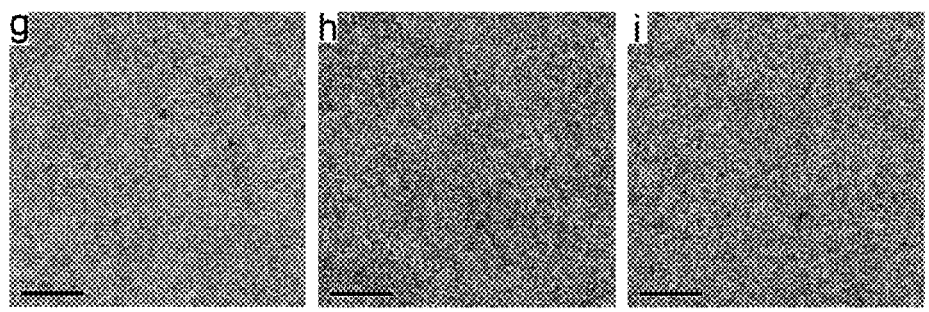
Figure 6A:
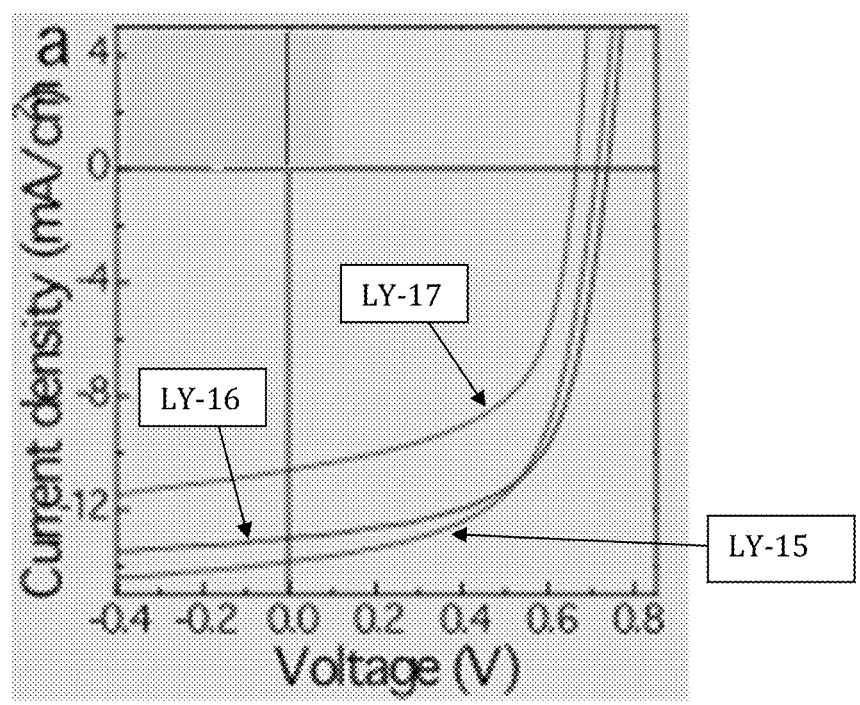
FIG. 6a is a graph of the current-voltage characteristics of polymer/fullerene solar cells prepared from mixed solvents.
Figure 6B:
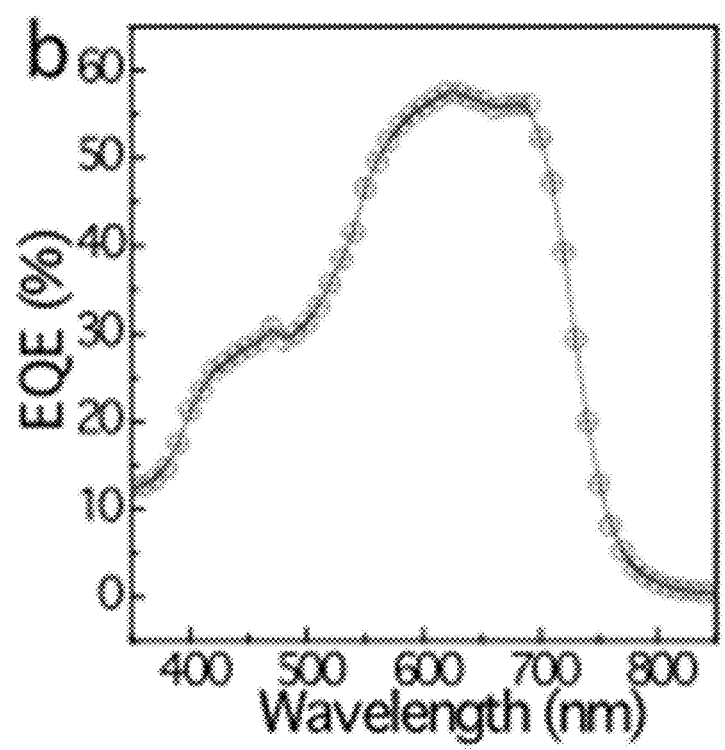
FIG. 6b is a graph of the external quantum efficiency of LY-16/$PC_{61}BM$ device prepared from mixed solvents.

This morphological problem can be remedied by using mixed solvents in preparing polymer/fullerides spin-coating solution. Primary study showed that the LY-15/PC$_{61}$BM blend film exhibited improved morphology by using dichlorobenzene/1,8-diiooctane (97/3, v/v) as solvent: there are no large features and it shows similar morphology as LY-12 or LY-14 blend film in TEM image. (FIG. 4g) The PCE of such polymer solar cell reaches to 5.85%. Similar morphology change for LY-16/PC$_{61}$BM and LY-17/PC$_{61}$BM blend films was observed (FIGS. 4h and 4i). Dramatic enhancement in solar cell performance can be observed both in LY-16 and LY-17 solar cells. (FIG. 6a) Besides the increase of the Voc, LY-16 solar cell shows larger Jsc than LY-17 one, possibly due to the higher hole mobility in fluorinated LY-16. It can also explain the slight increase of the FF in the LY-16 solar cell. Therefore, we have successfully improved the Voc from 0.58V to 0.74V (~28%) over LY-12 polymer system without scarification in photocurrent. The PCE from the LY-16/PC$_{61}$BM solar cell reached to 5.9%. FIG. 6b shows the EQE spectrum of LY-16/PC$_{61}$BM solar cell prepared from mixed solvent. It can very efficiently harvest the light in the maximum photon flux region (680 nm), showing over 50% from 550 nm to 750 nm. A spectral mismatch factor (M) of 0.965 can be calculated by inserting AM1.5G standard spectrum, Oriel solar simulator (with 1.5G filter) spectrum and EQE data. The efficiency of LY-16/PC$_{61}$BM solar cell thus reaches to 6.1%, which is the highest value so far for single layer polymer solar cells.

The invention claimed is:

1. A semiconducting polymer of the formula (I)

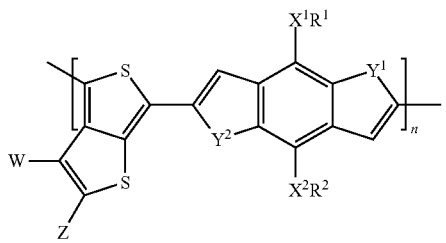

where $X^1$ and $X^2$ are independently O, S, N, NH, CR$^1$, CR$^2$, CHR$^1$, or CHR$^2$, where R$^1$ and R$^2$ are independently H, alkyl, alkoxy, aryl, aryloxy, heteroaryl, heteroaryloxy, oligo(ethylene glycol);

$Y^1$ and $Y^2$ are independently O, Se, or amino;

Z is an ester, amide, cyano, alkyl, or polyfluoroalkyl, polychloroalkyl, aryl, or heteroaryl;

W is H, halogen, cyano, dicyanovinyl, or tricyanovinyl; and n is an integer greater than 0.

2. The semiconducting polymer of claim 1, where $X^1$ and $X^2$ are independently O, S, NH, CHR$^1$, or CHR$^2$.

3. The semiconducting polymer of claim 2, where W is F or H.

4. The semiconducting polymer of claim 2, where $X^1$ and $X^2$ are independently CH$_2$ or O.

5. The semiconducting polymer of claim 2, where Z is O$_n$F$_{2n+1}$ or C$_n$H$_{2n+1}$, and n is an integer from 1 to 12.

6. The semiconducting polymer of claim 2, where Z is —COOR", where R" is alkyl, alkoxy, aryl, aryloxy, heteroaryl, or heteroaryloxy.

7. The semiconducting polymer of claim 6, where R" is

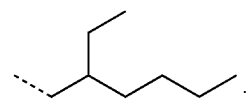
(II)

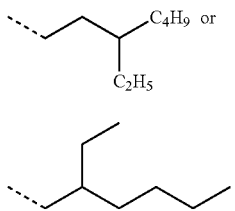

or

8. The semiconducting polymer of claim 2 where
$X^1$ and $X^2$ are CH$_2$,
Z is COOR",
W is H,
R$^1$ and R$^2$ are C$_7$H$_{15}$, and R" has the formula

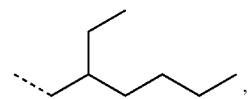

9. The semiconducting polymer of claim 2 where
$X^1$ and $X^2$ are O,
Z is COOR",
W is F or H,
R$^1$ and R$^2$ have the following formula:

(III)

and R" is C$_8$H$_{17}$.

10. A conjugate of a semiconducting polymer according to claim 1.

11. A conjugate of a semiconducting polymer according to claim 2 and an acceptor material.

12. The conjugate of semiconducting polymer of claim 1 where the acceptor material is a fullerene derivative.

13. The conjugate of a semiconducting polymer of claim 2 where the fullerene derivative is C$_{61}$ or C$_{71}$.

14. A conjugate of the semiconducting polymer according to claim 1, wherein Z is of the formula:

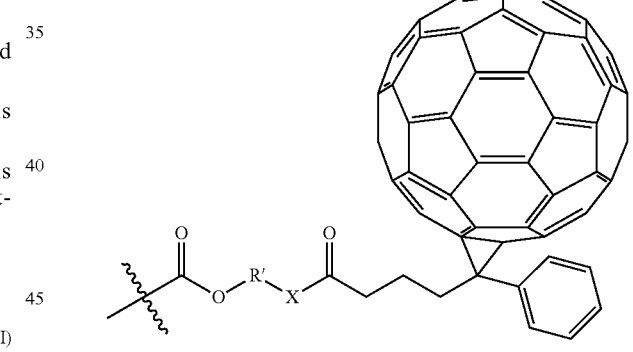

and R' is —(CH$_2$)$_m$— and m is an integer between 2 and 16; X is selected from O, S, NH, and —ONH—.

15. The conjugate of claim 14, where $X^1$ and $X^2$ are independently O, S, NH, CHR$^1$, or CHR$^2$.

16. The semiconducting polymer of claim 2 in a solar cell, an optical device, an electroluminescent device, a photovoltaic cell, semiconducting cell, or photodiode.

17. The conjugate of claim 1 in a solar cell, an optical device, an electroluminescent device, a photovoltaic cell, semiconducting cell, photodiode or polymeric field effect transistors.

18. A photovoltaic layer, comprising a semi-conducting polymer according to claim 2.

19. The semiconducting polymer of claim 6, where Z is C$_m$H$_{2m+1}$ and m is an integer from 1 to 30.

* * * * *